United States Patent
Park et al.

(10) Patent No.: US 8,872,148 B2
(45) Date of Patent: Oct. 28, 2014

(54) PHASE-CHANGE MEMORY DEVICES

(71) Applicants: Doo-Hwan Park, Yongin-si (KR);
Gyu-Hwan Oh, Hwaseong-si (KR);
Jeong-Min Park, Hwaseong-si (KR);
Kyung-Min Chung, Hwaseong-si (KR)

(72) Inventors: Doo-Hwan Park, Yongin-si (KR);
Gyu-Hwan Oh, Hwaseong-si (KR);
Jeong-Min Park, Hwaseong-si (KR);
Kyung-Min Chung, Hwaseong-si (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 0 days.

(21) Appl. No.: 13/735,180

(22) Filed: Jan. 7, 2013

(65) Prior Publication Data
US 2013/0256621 A1    Oct. 3, 2013

(30) Foreign Application Priority Data

Mar. 29, 2012  (KR) .................. 10-2012-0032365

(51) Int. Cl.
*H01L 27/10* (2006.01)
*H01L 45/00* (2006.01)
*H01L 27/24* (2006.01)

(52) U.S. Cl.
CPC ............. *H01L 45/06* (2013.01); *H01L 45/148* (2013.01); *H01L 27/2463* (2013.01); *H01L 45/144* (2013.01); *H01L 45/1233* (2013.01); *H01L 45/1683* (2013.01); *H01L 45/126* (2013.01); *H01L 27/2409* (2013.01); *H01L 45/143* (2013.01)
USPC ............... 257/2; 438/102; 438/381; 438/382; 438/104; 438/257

(58) Field of Classification Search
USPC ............... 257/2, 4, 530, E45.002, E27.07
See application file for complete search history.

(56) References Cited

U.S. PATENT DOCUMENTS

| | | |
|---|---|---|
| 2006/0246712 A1 | 11/2006 | Kim et al. |
| 2008/0003815 A1* | 1/2008 | Lee et al. ............. 438/653 |
| 2008/0078984 A1* | 4/2008 | Park et al. ............. 257/4 |
| 2008/0089111 A1 | 4/2008 | Lee et al. |
| 2009/0154222 A1 | 6/2009 | Chien et al. |
| 2009/0261313 A1 | 10/2009 | Lung et al. |
| 2010/0190321 A1* | 7/2010 | Oh et al. ............. 438/478 |
| 2010/0327250 A1* | 12/2010 | Park .................. 257/2 |
| 2011/0001114 A1 | 1/2011 | Zanderighl et al. |
| 2011/0020998 A1 | 1/2011 | Oh et al. |
| 2011/0155986 A1 | 6/2011 | Kim et al. |

FOREIGN PATENT DOCUMENTS

| | | |
|---|---|---|
| JP | 2011-014909 | 1/2011 |
| KR | 1020080039701 A | 5/2008 |
| KR | 1020090014023 A | 2/2009 |
| KR | 1020110035061 A | 4/2011 |
| KR | 10-1050781 | 7/2011 |

* cited by examiner

*Primary Examiner* — Chuong A Luu
*Assistant Examiner* — Rodolfo Fortich
(74) *Attorney, Agent, or Firm* — Volentine & Whitt, PLLC

(57) ABSTRACT

A phase-change memory device includes a diode, a plug, a doping layer pattern, a phase-change layer pattern and an upper electrode. The diode is disposed on a substrate. The plug is disposed on the diode and has a bottom surface whose area is equal to the area of a top surface of the diode. The plug is formed of metal or a conductive metallic compound. The doping layer pattern is disposed on the plug and has a bottom surface whose area is equal to the area of a top surface of the plug, and includes the same metal or conductive metallic compound as the plug. The phase-change layer pattern is disposed on the doping layer pattern. The upper electrode is disposed on the phase-change layer pattern.

18 Claims, 19 Drawing Sheets

FIRST
DIRECTION  SECOND
⊗ ⟶ DIRECTION

FIRST
DIRECTION  SECOND
⊗ ⟶ DIRECTION

FIRST DIRECTION ⊗ → SECOND DIRECTION

FIRST DIRECTION ⊗ → SECOND DIRECTION

FIRST
DIRECTION
⊗ → SECOND
DIRECTION

FIRST
DIRECTION
⊗ → SECOND
DIRECTION

PHASE-CHANGE MEMORY DEVICES

PRIORITY STATEMENT

This application claims priority under 35 USC §119 to Korean Patent Application No. 10-2012-0032365 filed on Mar. 29, 2012 in the Korean Intellectual Property Office (KIPO), the entire disclosure of which is hereby incorporated by reference.

BACKGROUND

1. Field

The inventive concept relates to phase-change memory devices and to methods of manufacturing the same.

2. Description of the Related Art

A phase-change memory device stores data using changes in resistance that occur when a phase-change layer pattern phase-transitions between an amorphous state and a crystalline state.

The phase-change memory device may include upper and lower electrodes provided on top and bottom surfaces of the phase-change layer pattern, respectively. In general, the lower electrode serves as a heater to convert current into Joule's heat. When resistance of the lower electrode is increased, total resistance of the phase-change memory device may increase upon writing. When the resistance of the lower electrode is reduced, operating current may increase.

SUMMARY

According to an aspect of the inventive concept, there is provided a phase-change memory device including a diode disposed on a substrate, a heating element disposed on the diode, a phase-change layer pattern disposed directly on the heating element, and comprising material whose state can be selectively changed under the control of the heater, and an upper electrode disposed on the phase-change layer pattern, and in which the heating element has a lower part of metal or a metallic compound that receives current from the diode, and an upper part contiguous with the lower part and capable of converting current supplied thereto from the conductive lower part to Joule's heat, the upper part of the heating element is of substantially the same metal or metallic compound as the lower part and contains a dopant of impurities by which the resistance of the upper part is made greater than that of the lower part, and the phase-change layer pattern is disposed directly on the upper part of the heating element. The upper part of the heating element thus serves as a heater for the phase-change layer pattern.

According to another aspect of the inventive concept, there is provided a phase-change memory device including a diode disposed on a substrate, a plug of metal or a conductive metallic compound disposed on the diode, a doping layer pattern located on the plug, a phase-change layer pattern disposed on the doping layer pattern, and an upper electrode disposed on the phase-change layer pattern, and in which the diode has a top surface and a bottom surface, the plug has a top surface and a bottom surface, the area of the bottom surface of the plug being is equal to the area of the top surface of the diode, the doping layer pattern has a bottom surface whose area is equal to the area of the top surface of the plug, and the doping layer pattern is of substantially the same metal or metallic compound as the plug and contains a dopant of impurities.

According to still another aspect of the inventive concept, there is provided a phase-change memory device including a diode disposed on a substrate, a plug disposed on the diode and comprising a metal silicide, a lower electrode comprising metal or a conductive metallic compound and disposed on the plug, a doping layer pattern on the lower electrode, a phase-change layer pattern disposed on the doping layer pattern, and an upper electrode disposed on the phase-change layer pattern, and in which the cross-sectional area of a bottom portion of the doping layer pattern is equal to the cross-sectional area of an upper portion of the lower electrode, the doping layer pattern is of substantially the same metal or conductive metallic compound as the lower electrode and contains a dopant of impurities, the cross-sectional area of the uppermost portion of the lower electrode is smaller than the area of the bottom surface thereof, and the area of the bottom surface of the phase-change layer pattern is substantially equal to that of the top surface of the doping layer pattern.

According to another aspect of the inventive concept, there is provided a method of manufacturing a phase-change memory device, which includes forming an insulating interlayer on a substrate, forming an opening through the insulating interlayer to expose the substrate, forming a diode on the substrate to fill a lower portion of the opening, forming a plug using a conductive metal or a metallic compound to fill an upper portion of the opening, forming a doping layer pattern by implanting impurities into an upper portion of the plug, forming a phase-change layer pattern on the doping layer pattern, and forming an upper electrode on the phase-change layer pattern.

BRIEF DESCRIPTION OF THE DRAWINGS

The inventive concept will be more clearly understood from the following detailed description of the preferred embodiments thereof taken in conjunction with the accompanying drawings.

DETAILED DESCRIPTION OF THE EMBODIMENTS

Figure 1:
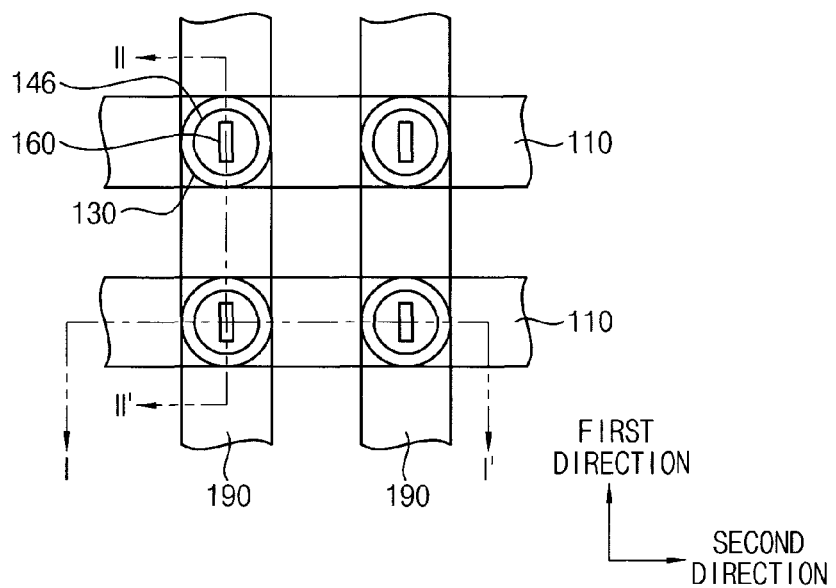
FIG. 1 is a plan view of a basic layout of a phase-change memory device in accordance with the inventive concept.

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, like numerals are used to designate like elements throughout the drawings.

It will also be understood that when an element or layer is referred to as being "on" or "connected to" another element or layer, it can be directly on or directly connected to the other element or layer or intervening elements or layers may be present. In contrast, when an element or layer is referred to as being "directly on" or "directly connected to" another element or layer, there are no intervening elements or layers present. The term "connected" may also be understood at times, given the context, to refer to an operative electrical connection.

Furthermore, spatially relative terms, such as "upper," and "lower" are used to describe an element's and/or feature's relationship to another element(s) and/or feature(s) as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use. In addition, the terms "upper" or "bottom" as used to describe a surface generally refer not only to the orientation depicted in the drawings but to the fact that the surface is the uppermost or bottommost surface in the orientation depicted, as would be clear from the drawings and context of the written description.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes. The term "extending" will generally reference a lengthwise or longitudinal direction. The term "pattern" may be used to refer to a single feature formed using a patterning process. Also, even though the specification refers to, at times, the forming of one such pattern by a particular process(es), in practice numerous ones of such patterns will be formed simultaneously when executing such a process(es).

Preferred embodiments of a phase-change memory device, and method of manufacturing the same, in accordance with the inventive concept will now be described in detail with reference to the accompanying drawings.

Figure 2A:
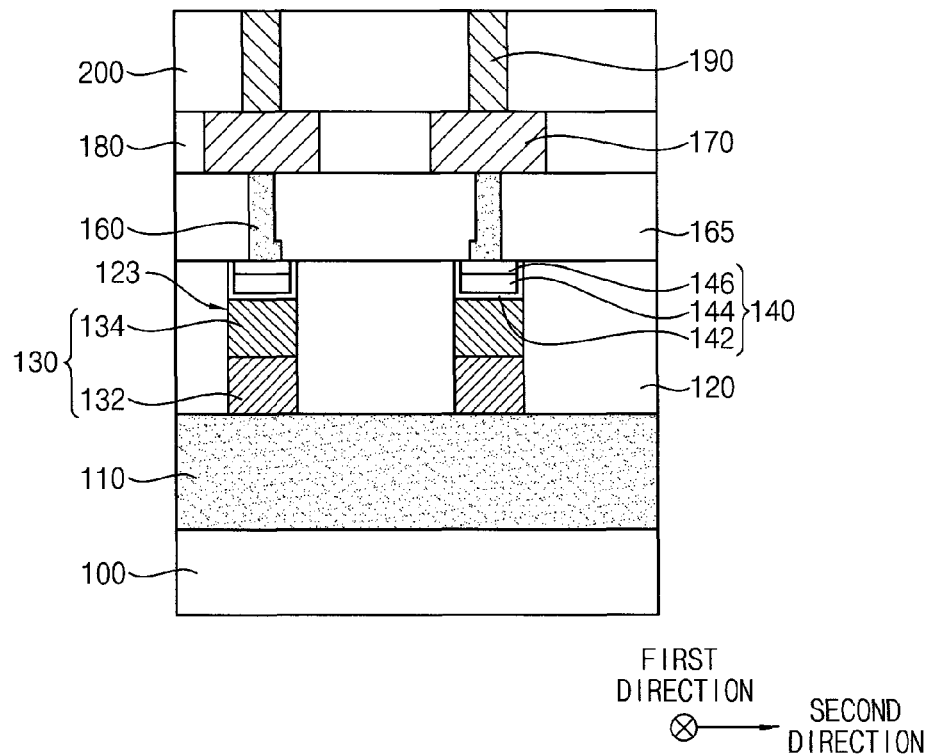
FIG. 2A is a sectional view of an embodiment of a phase-change memory device, taken along line I-I' of FIG. 1, according to the inventive concept.
Figure 2B:
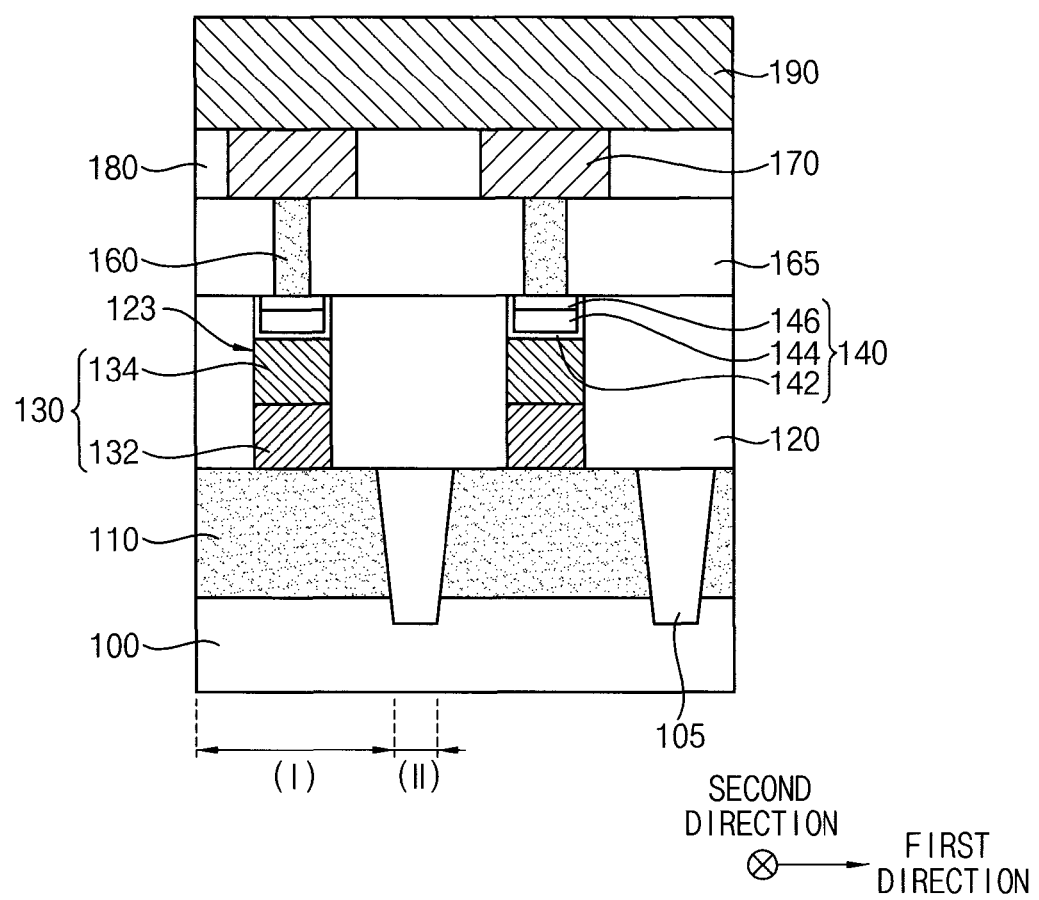
FIG. 2B is a sectional view of the phase-change memory device taken along line II-II' of FIG. 1.

Referring to FIGS. 1, 2A and 2B, a first embodiment of a phase-change memory device according to the inventive concept includes a substrate 100 having an impurity region 110, a P-N diode 130, a plug structure 140, a phase-change layer pattern 160 and an upper electrode 170. In addition, the phase-change memory device may further include a bit line 190 connected to the upper electrode 170.

The substrate 100 may comprise a semiconductor substrate, such as a silicon substrate, a germanium substrate or a silicon-germanium substrate, an SOI (silicon-on insulator) substrate, or a GOI (germanium-on-insulator) substrate. As shown in FIG. 2B, the substrate 100 may be divided into an active region I and an isolation region II by an isolation layer pattern 105. More specifically, a region of the substrate 100 where the isolation layer pattern 105 is disposed is defined as the isolation region II, and a region of the substrate 100 that is not occupied by the isolation layer pattern 105 is the active region I.

The impurity region 110 is disposed on the substrate 100 in the active region I. In the illustrated example of this embodiment, the impurity region 110 extends in the second direction and a plurality of impurity regions 110 may be disposed in the first direction perpendicular to the second direction. The impurity regions 110 may serve as word lines of the phase-change memory device.

A first insulating interlayer 120 is disposed on both of the impurity region 110 and the isolation layer pattern 105, and the P-N diode 130 occupies the lower portion of a first opening 123 that extends through the first insulating interlayer 120 and exposes part of the impurity region 110.

The P-N diode 130 may include first and second conductive patterns 132 and 134 sequentially laminated on the impurity region 110. For instance, the first conductive pattern 132 includes N type impurities and the second conductive pattern 134 includes P type impurities.

As shown in FIGS. 1, 2A and 2B, the first and second conductive patterns 132 and 134 may be cylindrical. Alternatively, the first and second conductive patterns 132 and 134 may each have the shape of a polygonal prism or cylindroid.

The plug structure 140 is disposed on the P-N diode 130 and may constitute a heating element as will become clearer from the description that follows. In addition, the bottom surface of the plug structure 140 may have a shape and area substantially identical to the shape and area of the top surface of the P-N diode 130. That is, the P-N diode 130 and the plug structure 140 may be sequentially laminated in an opening formed through the first insulating interlayer 120. Thus, the outer sides of the P-N diode 130 and the barrier layer pattern 142 are contiguous. More specifically, vertical projections of a lateral side of the P-N diode 130 and a lateral side of the plug structure 140 may be coextensive in the direction in which the opening extends through the first insulating interlayer 120.

The plug structure 140 may include a barrier layer pattern 142, a lower part in the form of a plug 144 and an upper part constituted by a doping layer pattern 146.

The barrier layer pattern 142 is disposed on the top surface of the P-N diode 130 and the sidewall of the first insulating interlayer 120. That is, the barrier layer pattern 142 may be cup-shaped or cylindrical. The barrier layer pattern 142 may prevent the plug 144 from lifting off of the top surface of the P-N diode 130 and the sidewall of the first insulating interlayer 120. In addition, the barrier layer pattern 142 can prevent metallic components included in the plug 144 from diffusing into the first insulating interlayer 120 and the P-N diode 130. In these respects, the barrier layer pattern 142 may include a metal, such as tantalum (Ta), titanium (Ti), ruthenium (Ru), cobalt (Co) or manganese (Mn), or a metallic nitride, such as titanium nitride (TiN) or tantalum nitride (TaN). In one example of this embodiment, the barrier layer pattern 142 is a layer of TiN such that low contact resistance is created between the plug structure 140 and the P-N diode 130.

The plug 144 may be disposed on the barrier layer pattern 142 while filling a lower portion of a space defined by the barrier layer pattern 142. The plug 144 may include a metal having relatively low resistance, such as tungsten (W), titanium (Ti), tantalum (Ta), molybdenum (Mo), hafnium (Hf), zirconium (Zr), chrome (Cr), niobium (Nb), or vanadium (V), or a conductive metallic compound.

The doping layer pattern 146 may be disposed on the plug 144 while filling an upper portion of the space defined by the barrier layer pattern 142. The doping layer pattern 146 may be relatively thin, i.e., is significantly thinner than the plug 144 and may have a thickness in the range of about 10 nm to about 20 nm.

The doping layer pattern 146 serves as a heater that heats the phase-change layer pattern 160 by converting current applied through the P-N diode 130 into Joule's heat. In addition, the doping layer pattern 146 may include a material having specific resistance higher than that of material constituting the plug 144. To this end, the doping layer pattern 146 may be of metal or a conductive metallic compound substantially identical to the metal or conductive metallic compound forming the plug 144 and doped with impurities. The impurities may include group 4A elements such as carbon (C), germanium (Ge), tin (Sn), lead (Pb) and silicon (Si), group 5A elements such as nitrogen (N), phosphor (P), arsenic (As), antimony (Sb), and bismuth (Bi), or group 6A elements such as oxygen (O), sulfur (S), selenium (Se), tellurium (Te), and polonium (Po). Preferably, the impurities are selected from the group consisting of carbon (C), nitrogen (N), oxygen (O), aluminum (Al), boron (B), phosphor (P), and silicon (Si). In examples of this embodiment, the doping layer pattern 146 is a layer of tungsten nitride, tungsten carbide, or tungsten silicide. Thus, the doping layer pattern 146 may effectively heat the phase-change layer pattern 160 using a relatively low operating current.

The phase-change layer pattern 160, disposed on the doping layer pattern 146 and the sidewall of the phase-change layer pattern 160, is surrounded by a second insulating interlayer 165 formed on the first insulating interlayer 120 and the plug structure 140. The bottom surface of the phase-change layer pattern 160 may be smaller than the top surface of the doping layer pattern 146. That is, the phase-change layer pattern 160 may partially cover the doping layer pattern 146. Since a relatively small contact area is formed between the phase-change layer pattern 160 and the doping layer pattern 146, the operating current required for the phase-change of the phase-change layer pattern 160 may be reduced.

As shown in FIGS. 1, 2A and 2B, the phase-change layer pattern 160 may substantially have the shape of a rectangular prism. Alternatively, though, the phase-change layer pattern 160 may substantially have the shape of a polygonal prism, may be cylindrical or may have the shape of a cylindroid.

The phase-change layer pattern 160 is of material which can be phase-changed by receiving heat through the doping layer pattern 146. In this respect, the phase-change layer pattern 160 may include a chalcogenide compound or a chalcogenide compound doped with carbon, nitrogen and/or metal. The chalcogenide compound may include materials having a compositional formula of D1GeSbTe, D2GeBiTe, D3SbTe, D4SbSe, or D5Sb, wherein D1 includes at least one element selected from the group consisting of C, N, Si, Bi, In, As, and Se, D2 includes at least one element selected from the group consisting of C, N, Si, In, As, and Se, D3 includes at least one group 5B element such as Ta, Nb and V, or at least one group 6B element such as W, Mo, and Cr, N, P, As, Sn or SnIn, D4 includes at least one group 5A element such as N, P, As, Sb, and Bi and at least one group 6A element such as O, S, Te and Po, and D5 includes Ge, Ga, or In or a combination of at least two of such elements. Preferably, the chalcogenide compound is GeSbSe, SbSe, GeSbTe, SbTe, GeSb, AsSbTe, SnSbTe, or SnInSbTe.

The upper electrode 170 may be disposed on the phase-change layer pattern 160, and in this case the lateral side of the upper electrode 170 is surrounded by a third insulating interlayer 180 disposed on the second insulating interlayer 165. Also, the upper electrode 170 may comprise doped polysilicon, a metal, a metal nitride or a metal silicide.

Meanwhile, the bit lines 190 may be electrically connected to the upper electrode 170. In an example of this embodiment, the bit lines 190 extend longitudinally in the first direction and are spaced from each other in the second direction. The sidewall of each bit line 190 is surrounded by a protective layer 200.

In this embodiment, the phase-change memory device includes the plug structure 140 and the P-N diode 130, in which the bottom surface of the plug structure 140 has an area the same as that of the top surface of the P-N diode 130. Therefore, the phase-change memory device has a simple structure and the manufacturing process for the phase-change memory device is relatively simple. In addition, the phase-change memory device includes the doping layer pattern 146 having a relatively high resistance, so no separate lower electrode is required.

Figure 3:
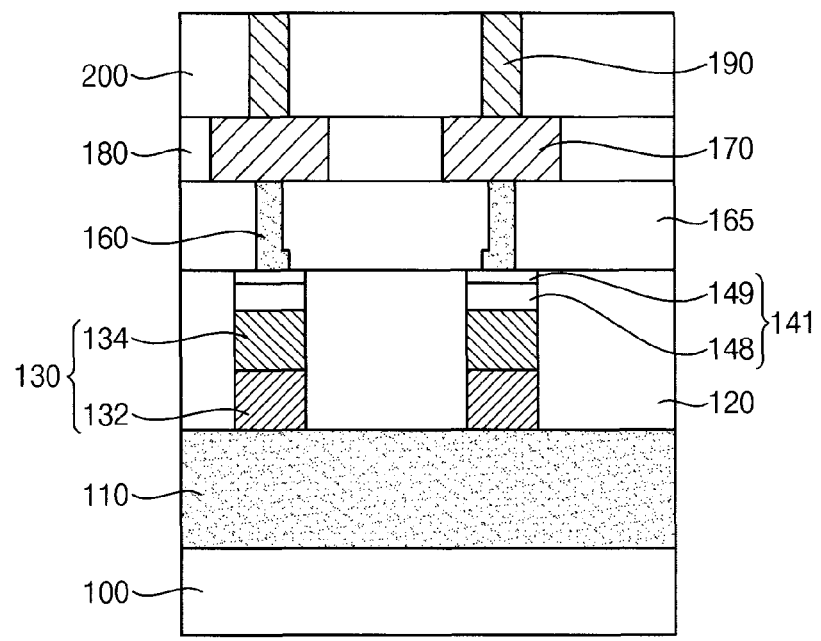
FIG. 3 is a sectional view of another embodiment of a phase-change memory device in accordance with the inventive concept.

FIG. 3 is a sectional view of another example of the first embodiment of a phase-change memory device in accordance with the inventive concept. The phase-change memory device illustrated in FIG. 3 is substantially similar to the phase-change memory device described with reference to FIGS. 1, 2A and 2B except for the plug structure 140.

Referring to FIG. 3, the phase-change memory device includes a substrate 100 having an impurity region 110, a P-N diode 130, a plug structure 141 constituting a heating element, a phase-change layer pattern 160, and an upper electrode 170. In addition, the phase-change memory device may further include a bit line 190 connected to the upper electrode 170.

The P-N diode 130 including first and second conductive patterns 132 and 134 is disposed on the impurity region 110 of the substrate 100, and the sidewall of the P-N diode 130 is surrounded by a first insulating interlayer 120 formed on the substrate 100.

The plug structure 141 may be disposed on the P-N diode 130. In addition, the shape and area of the bottom surface of the plug structure 141 may be substantially identical to the shape and area of the top surface of the P-N diode 130. That is, the P-N diode 130 and the plug structure 141 may be sequentially laminated in the first opening 123 formed through the first insulating interlayer 120. Thus, projections of a lateral side of the P-N diode 130 and a lateral side of the plug structure 141 may be coextensive. The plug structure 141 includes a plug 148 as its lower part and a doping layer pattern 149 as its upper part.

The plug 148 in this embodiment is disposed directly on the P-N diode 130. For instance, the plug 148 may be of a metal such as W, Ti, Ta, Mo, Hf, Zr, Cr, Nb or V, or a conductive metallic compound including N, C, Al, B, P, O or Si. Preferably, the plug 148 comprises a metal nitride having a metal such as Ti, Ta, Mo, Hf, Zr, Cr, Nb or V. In the case in which the plug 148 is of TiN, the plug 148 has a relatively low resistance and a superior interfacial characteristic with respect to the P-N diode 130 and the first insulating interlayer 120.

The doping layer pattern 149 is disposed on the plug 148. The doping layer pattern 149 may be relatively thin, i.e., significantly thinner than the plug 148 and preferably has a thickness in the range of about 10 nm to about 20 nm. The doping layer pattern 149 serves as a heater that converts current applied through the P-N diode 130 into Joule's heat. In addition, the doping layer pattern 149 may include a material having specific resistance higher than that of material constituting the plug 148. For instance, the doping layer pattern 149 may be of a conductive metallic compound substantially identical to the metallic compound of the plug 148 and doped with impurities. The impurities may be selected from among group 4A elements such as carbon (C), germanium (Ge), tin (Sn), lead (Pb) and silicon (Si), group 5A elements such as nitrogen (N), phosphor (P), arsenic (As), antimony (Sb), and bismuth (Bi), or group 6A elements such as oxygen (O), sulfur (S), selenium (Se), tellurium (Te), and polonium (Po). Preferably, the impurities are selected from the group consisting of carbon (C), nitrogen (N), oxygen (O), aluminum (Al), boron (B), phosphor (P), and silicon (Si). Also, preferably, the doping layer pattern 149 is of TiCN, TiSiN or TiON. Thus, the doping layer pattern 149 may effectively heat the phase-change layer pattern 160 using a relatively low operating current.

In this embodiment, the phase-change memory device includes the plug structure 141 and the P-N diode 130, in which the bottom surface of the plug structure 141 has an area the same as that of the top surface of the P-N diode 130. Therefore, the phase-change memory device has a simple structure and the manufacturing process for the phase-change memory device is relatively simple. In addition, the doping layer pattern 149 of the phase-change memory device may have a relatively high resistance, so that no lower electrode is required. Also, a barrier layer pattern can be omitted without problem in the case in which the plug 148 of the phase-change memory device is of a metallic compound.

Figure 4:
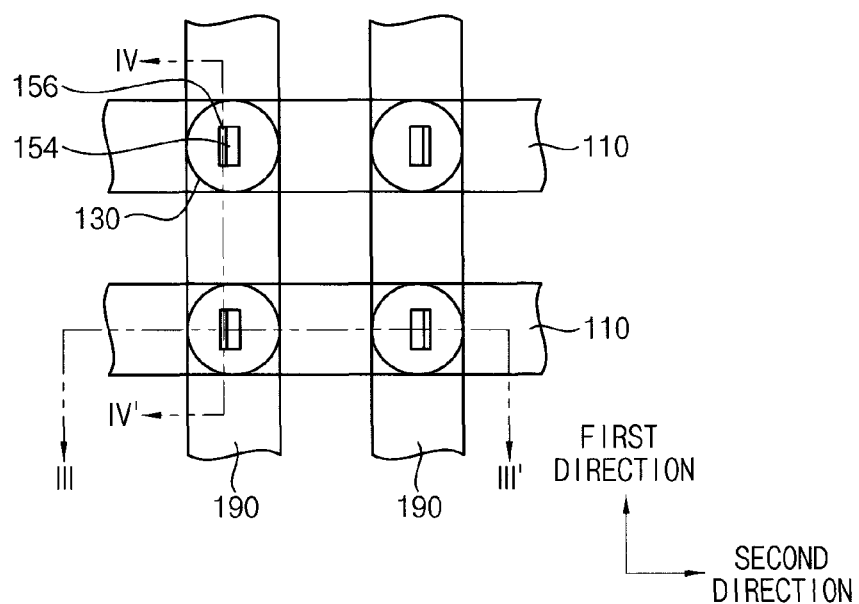
FIG. 4 is a plan view of the layout of another embodiment of a phase-change memory device in accordance with the inventive concept.
Figure 5A:
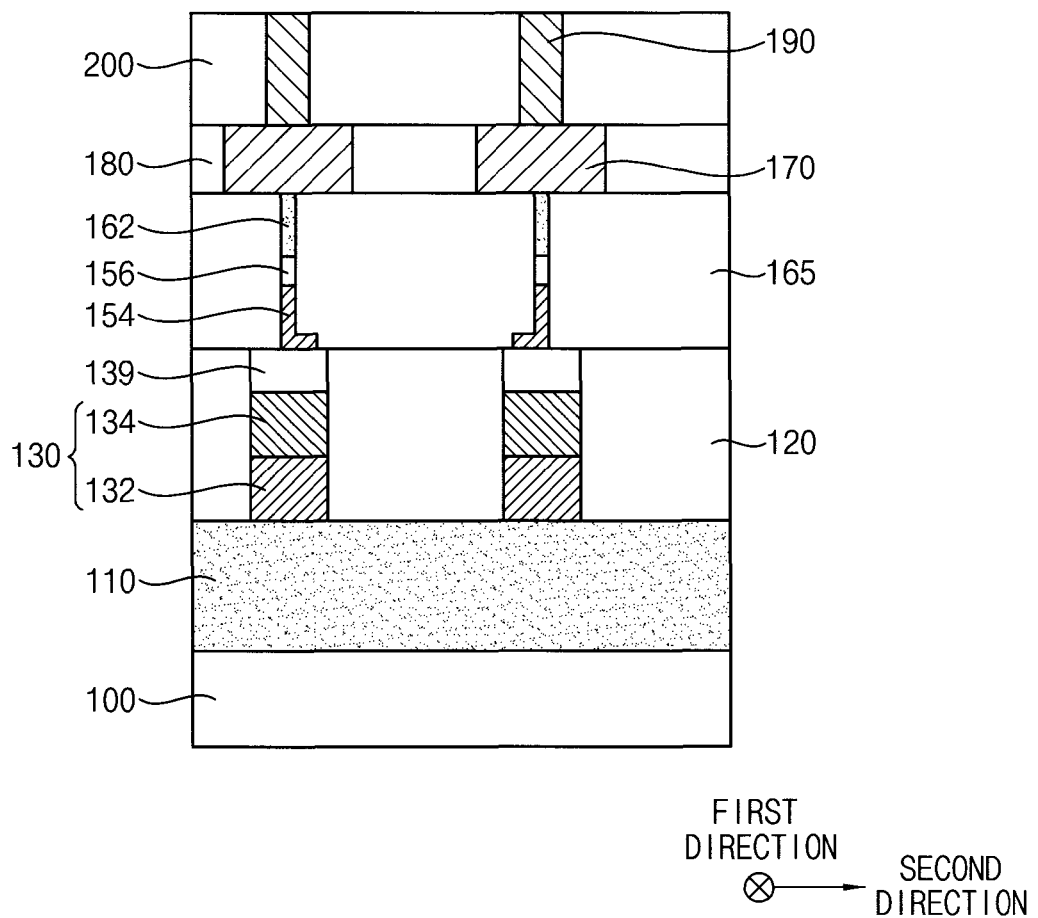
FIG. 5A is a sectional view of the a phase-change memory device taken along line III-III' of FIG. 4.
Figure 5B:
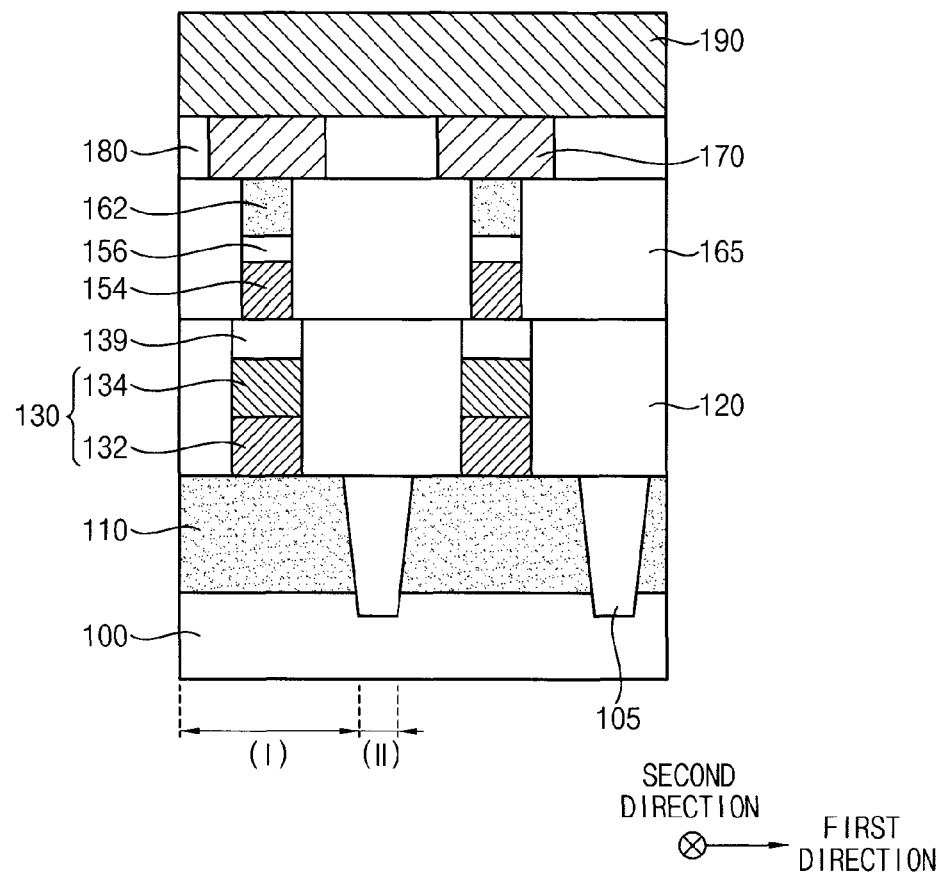
FIG. 5B is a sectional view of the phase-change memory device taken along line IV-IV' of FIG. 4.

Referring to FIGS. 4, 5A and 5B, another embodiment of a phase-change memory device according to the inventive concept includes a substrate 100 having an impurity region 110, a P-N diode 130, a lower electrode 154, a doping layer pattern 156, a phase-change layer pattern 162 and an upper electrode 170. In addition, the phase-change memory device may further include a bit line 190 connected to the upper electrode 170.

As shown in FIG. 5B, the substrate 100 may be divided into an isolation region II and an active region I. The impurity region 110 is disposed on the active region I of the substrate 100 and an isolation layer pattern 105 is disposed in the isolation region II.

The P-N diode 130 including first and second conductive patterns 132 and 134 is disposed on the impurity region 110, and the sidewall of the P-N diode 130 is surrounded by a first insulating interlayer 120 formed on the impurity region 110 and the isolation layer pattern 105

A plug 139 is disposed on the P-N diode 130. The P-N diode 130 and the plug 139 may be sequentially disposed in an opening extending through the first insulating interlayer 120.

In this respect, the plug 139 may be of a metal silicide such as CoSi, NiSi, or FeSi. In this case, the plug 139 may have low contact resistance with respect to the lower electrode 154 and the P-N diode 130.

The lower electrode 154 is disposed on the plug 139. The lower electrode 154 may include a top surface having an area smaller than that of a bottom surface of the lower electrode 154. To this end, the lower electrode may have the shape of an "L", "J" or "U". For instance, the lower electrode may have an "L" shape whose lower portion contacts the top surface of the plug 139 over a relatively large area, and whose upper portion extends vertically from the lower portion. Since the bottom surface of the lower electrode 154 has a relatively large area, contact resistance between the lower electrode 154 and the plug 139 may be reduced. In addition, since the top surface of the lower electrode 154 has a relatively small area, the phase-change material may be effectively heated using a relatively low operating current.

The lower electrode 154 may be of a metal, such as Ti, Ta, Mo, Hf, Zr, Cr, Nb or V, or a conductive metallic compound including N, C, Al, B, P, O or Si. For instance, the lower electrode 154 may be of a metal nitride, such as TiN or TaN.

In the case in which the lower electrode 154 is of TiN, the lower electrode 154 may have relatively low resistance and a superior interfacial characteristic with respect to the plug 139.

The doping layer pattern 156 is disposed on the lower electrode 154. The doping layer pattern 156 may be relatively thin, e.g., may have a thickness in the range of about 10 nm to about 20 nm and may be formed with a bottom surface having an area equal to that of the top surface of the lower electrode 154. The doping layer pattern 156 may serve as a heater that converts current applied through the P-N diode 130 into Joule's heat. In addition, the doping layer pattern 156 may include a material having a specific resistance higher than that of the material constituting the lower electrode 154. For instance, the doping layer pattern 156 may be of a conductive metallic compound substantially identical to the metallic compound of the lower electrode 154 and doped with impurities. The impurities may be selected from group 4A elements such as carbon (C), germanium (Ge), tin (Sn), lead (Pb) and silicon (Si), group 5A elements such as nitrogen (N), phosphor (P), arsenic (As), antimony (Sb), and bismuth (Bi), or group 6A elements such as oxygen (O), sulfur (S), selenium (Se), tellurium (Te), and polonium (Po). Preferably, the impurities are selected from the group consisting of carbon (C), nitrogen (N), oxygen (O), aluminum (Al), boron (B), phosphor (P), and silicon (Si). In the case in which the doping layer pattern 156 is of TiCN, TiSiN or TiON. Thus, the doping layer pattern 156 may effectively heat the phase-change layer pattern 162 using a relatively low operating current.

Thus, in this embodiment the lower electrode 154 and doping layer pattern 156 constitute a heating element, with the lower electrode 154 being a lower part of the heating element and the doping layer being an upper part of the heating element serving as a heater for the phase-change layer pattern.

The phase-change layer pattern 162 is disposed on the doping layer pattern 156. In addition, the top surface of the phase-change layer pattern 162 may have an area and a shape identical to those of the bottom surface of the doping layer pattern 156. Thus, in this case, a projection of the lateral side of the phase-change layer pattern 162 and a lateral side of the doping layer pattern 156 are coextensive.

The upper electrode 170 is disposed on the phase-change layer pattern 162.

In this embodiment, the phase-change memory device includes the metal silicide plug 139. Accordingly, a barrier layer pattern and a metal, e.g., tungsten (W), plug may be omitted. In addition, the phase-change memory device includes the lower electrode 154 and the phase-change layer pattern 162, in which the bottom surface of the phase-change layer pattern 162 has an area the same as that of the top surface of the lower electrode 154. Therefore, the phase-change memory device may have a simple structure and the manufacturing process of the phase-change memory device is relatively simple. In addition, the phase-change memory device may include the doping layer pattern 156 having a relatively high resistance, so that the phase-change memory device may be operated using a low operating current.

A method of manufacturing a phase-change memory device in accordance with the inventive concept is illustrated in FIGS. 6 to 13.

Figure 6:
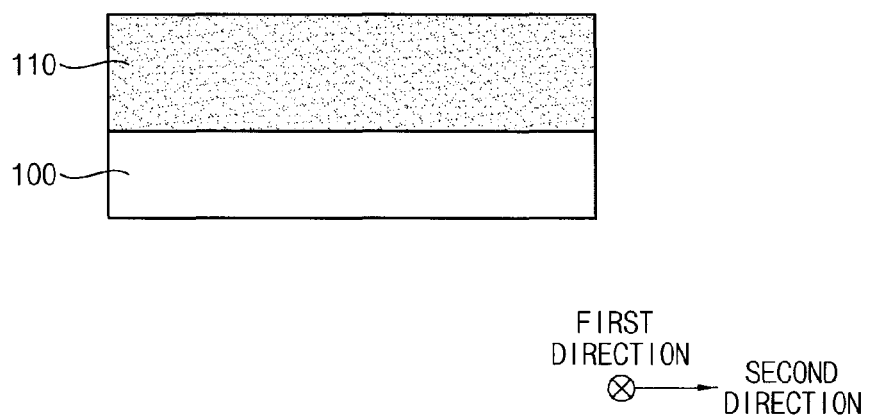
FIGS. 6 to 20 are sectional views illustrating an embodiment of a method of manufacturing a phase-change memory device, of the type shown in FIGS. 1-2B, in accordance with inventive concept.

Referring to FIG. 6, the impurity region 110 is formed on the substrate 100.

The substrate 100 may comprise a semiconductor substrate. For instance, a silicon substrate, a germanium substrate, a silicon-germanium substrate, an SOI (silicon-on insulator) substrate, or a GOI (germanium-on-insulator) substrate may be used as the substrate 100.

The impurity region 110 is formed on the substrate 100 through an impurity implantation process. In practice, a plurality of impurity regions 110 are formed in the first direction, with each impurity region 110 elongated (i.e., extending longitudinally) in the second direction to serve as a word line of the phase-change memory device.

Although not shown in FIG. 6, the isolation layer pattern is formed on the substrate 100 to divide the substrate 100 into the active region I and the isolation region II.

Figure 7:
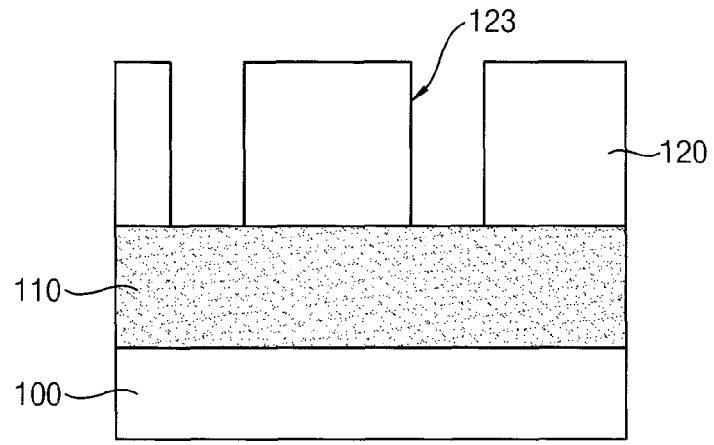

Referring to FIG. 7, the first insulating interlayer 120 having the first opening 123 is formed on the substrate 100 and the impurity region 110.

For instance, the first insulating interlayer 120 may be formed through a CVD process, PECVD process, spin coating process or HDP-CVD process using silicon oxide, such as BPSG, USG or SOG. Then, the first insulating interlayer 120 is selectively etched to form the first opening 123 that exposes part of the impurity region 110.

Figure 8:
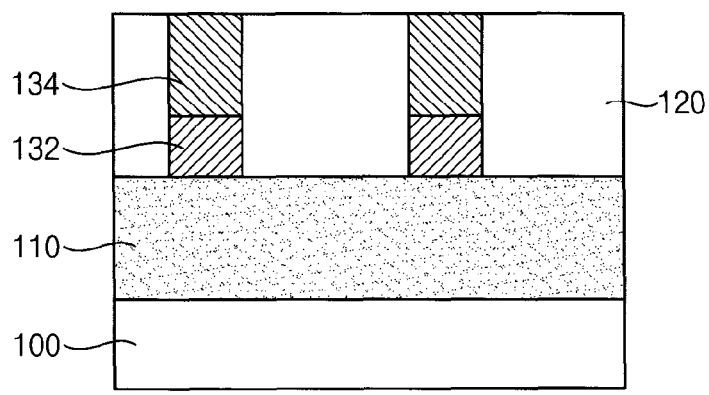

Referring to FIG. 8, conductive patterns are formed on the impurity region 110 to fill the first opening 123.

More specifically, a conductive layer is formed to such a thickness as to fill the first opening 123. In this respect, the conductive layer can be formed through a selective epitaxial growth (SEG) process using the impurity region 110 exposed through the first opening 123 as a seed. Then, an upper portion of the conductive layer is removed through a chemical mechanical polishing process and/or etch-back process until the top surface of the conductive layer is level with the top surface of the first insulating interlayer 120. Next, impurities are implanted into the conductive layer to form the first and second conductive patterns 132 and 134. At this time, the first and second conductive patterns 132 and 134 may have impurities different from each other. For instance, N type impurities may be implanted to form the first conductive pattern 132, and then P type impurities may be implanted into the upper portion of the conductive layer to form the second conductive pattern 134.

Figure 9:
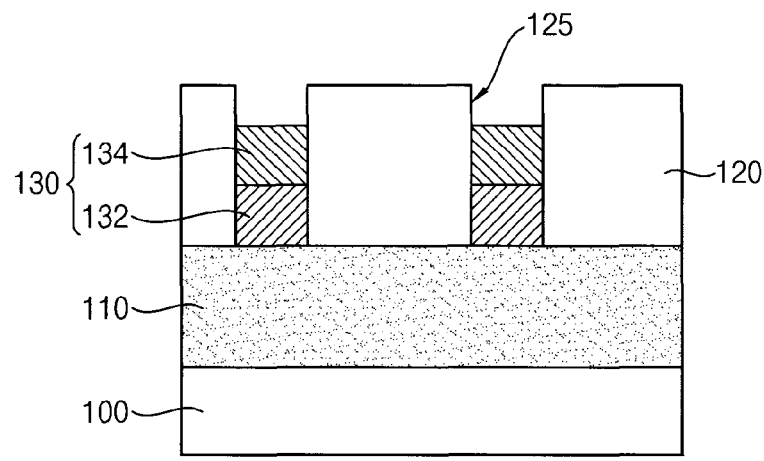

Referring to FIG. 9, the second conductive pattern 134 is partially removed to form a first recess 125.

In this respect, the second conductive pattern 134 may be partially removed through a dry etching process or wet etching process. Thus, in either case, the first recess 125, which exposes the top surface of the second conductive pattern 134 and the sidewall of the first insulating interlayer 120, is formed. As a result, the P-N diode 130 having the first and second conductive patterns 132 and 134 fills the lower portion of the first opening 123.

Figure 10:
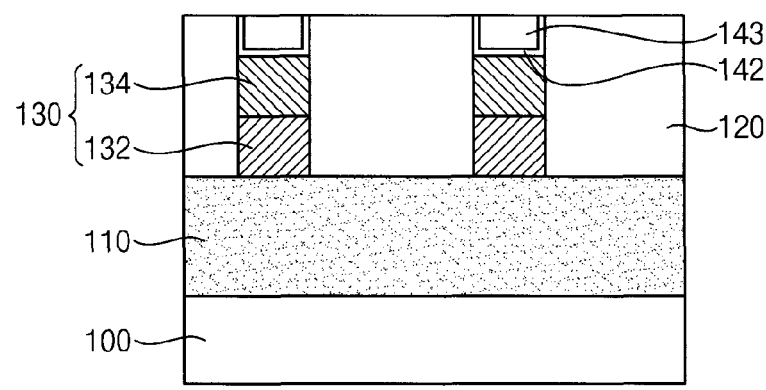

Referring to FIG. 10, a barrier layer pattern 142 and a preliminary plug 143 are then formed to fill the first recess 125.

Specifically, a barrier layer is formed conformally along exposed surfaces of the first insulating interlayer 120 and the upper surface of the P-N diode 130. Then, a preliminary plug layer is formed on the barrier layer to such a thickness that the barrier layer is covered and the remaining part of the first recess 125 is filled with the preliminary plug layer. Then, a CMP process and/or etch-back process is performed until the top surface of the first insulating interlayer 120 is exposed, thereby forming the barrier layer pattern 142 and the preliminary plug 143 to fill the first recess 125.

In this method, the barrier layer can be formed through a sputtering process, CVD process, PECVD process or ALD process using a metal such as Ta, Ti, Ru, Co or Mn, or a metal nitride such as TiN or TaN. In the case in which the barrier layer is of a metal nitride, such as TiN, the barrier layer may have a superior interfacial characteristic that facilitates the forming of the preliminary plug layer of metal on the barrier layer.

Also, in this method, the preliminary plug layer can be formed through a CVD process, PECVD process or ALD process using a metal such as W, Ti, Ta, Mo, Hf, Zr, Cr, Nb or V, or a metallic compound including at least one such metal.

Figure 11:
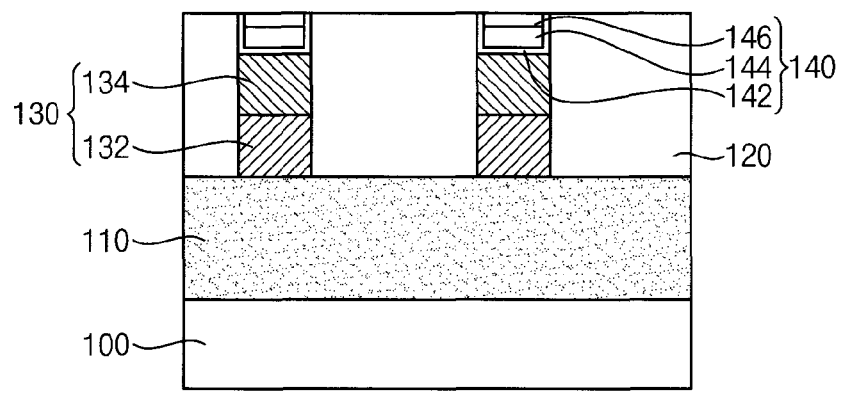

Referring now to FIG. 11, the plug 144 and the doping layer pattern 146 are formed by implanting impurities into the upper portion of the preliminary plug 143. The impurities may be selected from group 4A elements such as carbon (C), germanium (Ge), tin (Sn), lead (Pb) and silicon (Si), from group 5A elements such as nitrogen (N), phosphor (P), arsenic (As), antimony (Sb), and bismuth (Bi), or from group 6A elements such as oxygen (O), sulfur (S), selenium (Se), tellurium (Te), and polonium (Po). Preferably, the impurities are selected from the group consisting of carbon (C), nitrogen (N), oxygen (O), aluminum (Al), boron (B), phosphor (P), and silicon (Si).

The impurity implantation can be effected by a heat treatment process or a plasma surface treatment process. In an example of the plasma surface treatment process, nitrogen is implanted into the top surface of a preliminary plug 143 of tungsten (W) using plasma formed by source gas comprising nitrogen ($N_2$) or ammonia ($NH_3$). Therefore, a plug 144 of tungsten (W), i.e., a metal, is formed and the doping layer pattern 146 of tungsten nitride (WN), i.e., a metal nitride, is formed on the top surface of the plug 144. Likewise, the doping layer pattern 146 can be formed of a metal carbide by implanting carbon into the upper portion of the preliminary plug 143 through the plasma surface treatment process.

Preferably, the impurities are implanted to a depth of about 10 nm to about 20 nm in the above process. That is, the doping layer pattern 146 can be formed to a thickness in a range of about 10 nm to about 20 nm. In addition, the doping layer pattern 146 is formed of material whose electric resistance is higher than that of the plug 144 so that it may serve as a heater that converts current into Joule's heat.

In the above-described examples of this embodiment, the plug 144 and the doping layer pattern 146 are sequentially formed in the same opening as the P-N diode 130. Thus, the process for forming the plug 144 and the doping layer pattern 146 is relatively simple. In addition, the manufacturing process for the phase-change memory device is relatively simple because separate structure for providing a heater or lower electrode is not required.

Figure 12:
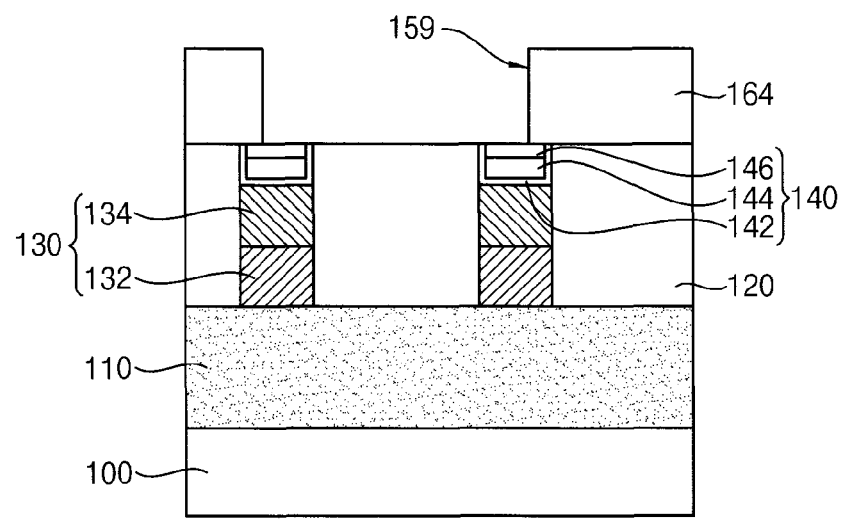

Referring to FIG. 12, next, a preliminary second insulating interlayer 164 is formed on the first insulating interlayer 120 and the plug structure 140 through a CVD process, PECVD process, spin coating process or HDP-CVD process. In this respect, the preliminary second insulating interlayer 164 may be formed of silicon nitride. Then, the preliminary second insulating interlayer 164 is selectively etched to form a second opening 159 that expose part of the top surface of at least one plug structure 140 and the top surface of the first insulating interlayer 120.

Figure 13:
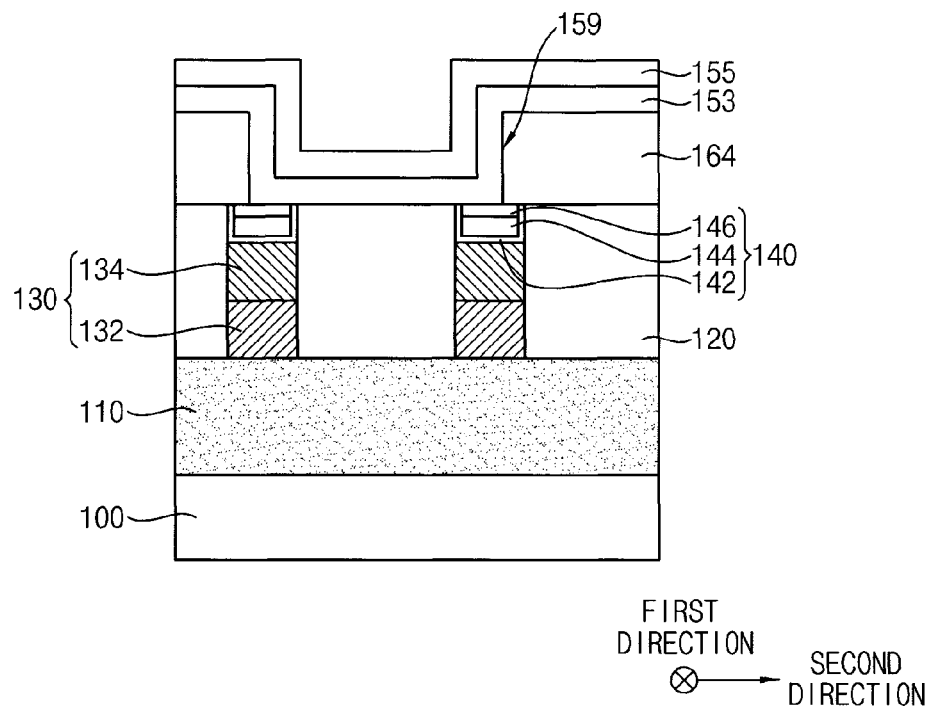

Referring to FIG. 13, a sacrificial layer 153 and a mask layer 155 are sequentially formed on the top surfaces of the first insulating interlayer 120 and the plug structure 140, which are exposed through the second opening 159, a sidewall delimiting the second opening 159, and the preliminary second insulating interlayer 164.

The sacrificial layer 153 can be formed of silicon oxide, such as BPSG, USG or SOG, through an ALD process or CVD process. In addition, the mask layer 155 can be formed of an insulating material, such as silicon nitride, through a CVD process, PECVD process, spin coating process or HDP- CVD process. In these ways, the sacrificial layer 153 and the mask layer 155 may be conformally formed with a uniform thickness on the top surfaces of the first insulating interlayer 120 and the plug structure 140, which are exposed through the second opening 159, the sidewall delimiting the second opening 159, and the preliminary second insulating interlayer 164.

Figure 14:
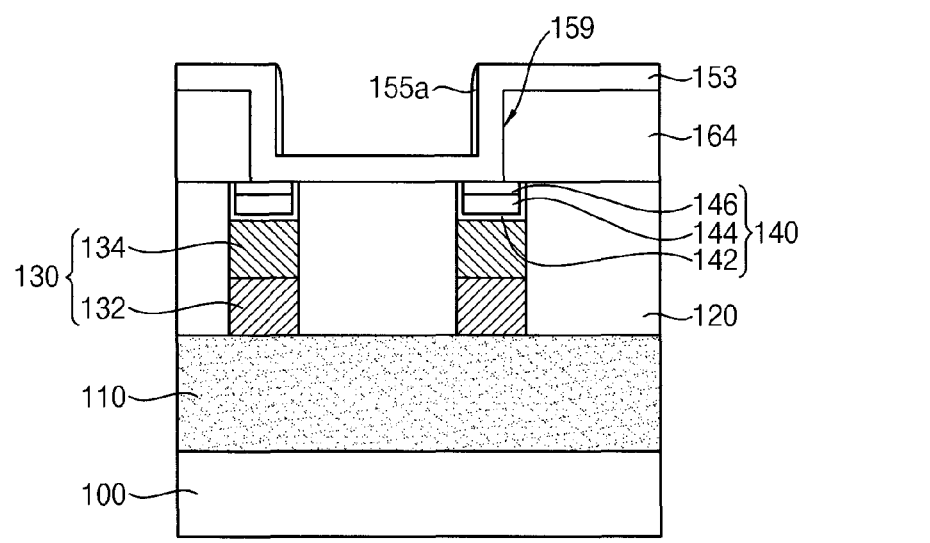

Referring to FIG. 14, a mask 155a may be formed by etching the mask layer 155 through an anisotropic etching process. As a result, the mask 155a covers the sidewall of the sacrificial layer 153 and now delimits the sides of the second opening 159.

Figure 15:
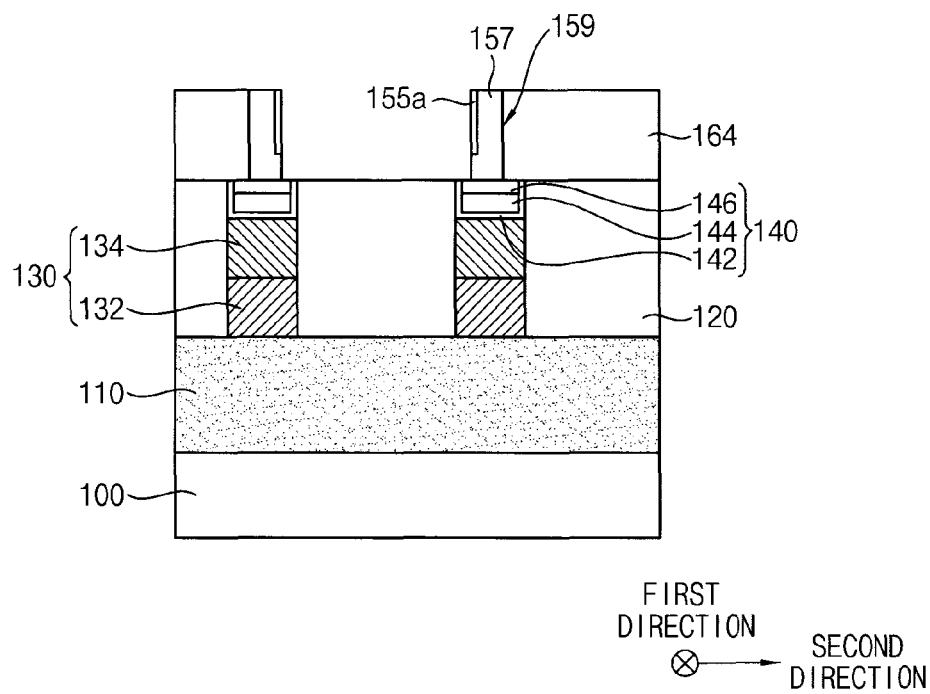

Referring to FIG. 15, a sacrificial layer pattern 157 is formed by removing part of the sacrificial layer 153 through an etching process.

For example, that part of the sacrificial layer 153 located on the preliminary second insulating interlayer 164, the first insulating interlayer 120 and the plug structure(s) 140 may be removed through a dry etching process. As a result, in this embodiment, the remainder of the sacrificial layer 153 contacts the sidewall of the preliminary second insulating interlayer 164 and extends in the first direction. In addition, the remainder of the sacrificial layer 153 constitutes a plurality of sacrificial layer patterns 157 extending in the first direction and spaced from each other in the second direction.

Figure 16:
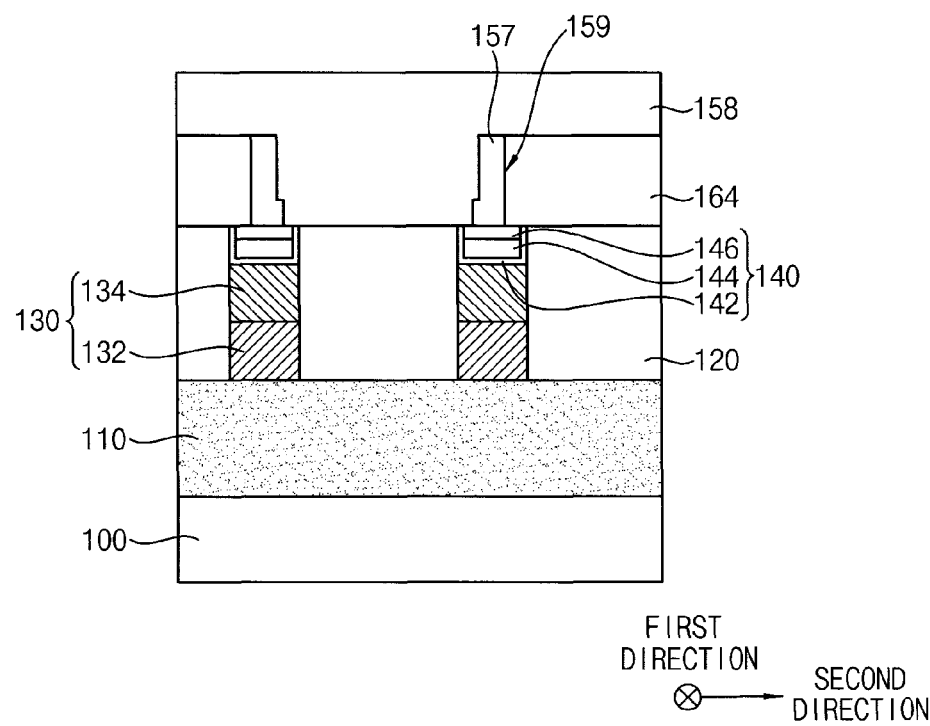

Referring to FIG. 16, an insulating layer 158 is formed on the first insulating interlayer 120 to a thickness sufficient for filling the remaining part of the second opening 159.

The insulating layer 158 can be formed of silicon nitride, for example, through a CVD process, PECVD process, spin coating process or HDP-CVD. That is, the insulating layer 158 can be formed by using a material substantially identical to the material constituting the preliminary second insulating interlayer 164 and/or the mask 156.

Figure 17:
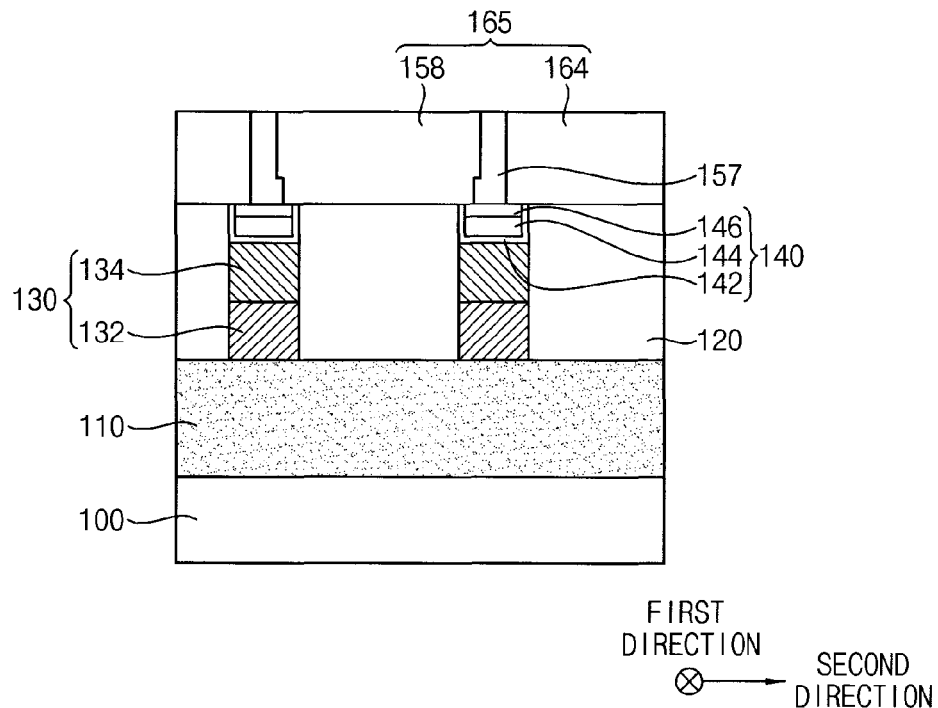

Referring to FIG. 17, the second insulating interlayer 165 is formed by polishing the insulating layer 158.

For example, an upper portion of the insulating layer 158 is removed by performing a CMP process and/or the etch-back process until the top surface of the second insulating interlayer 165 is exposed. Thus, the second insulating interlayer 165 surrounding the sides of the sacrificial layer pattern 157 can be formed on the first insulating interlayer 120 and the plug structure 140.

Figure 18:
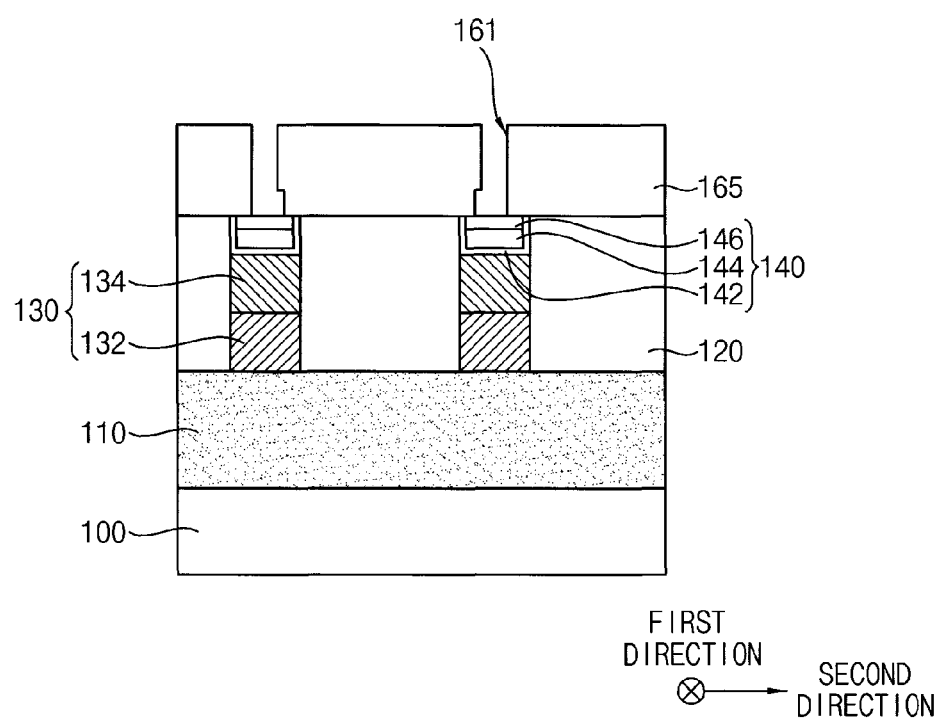

Referring to FIG. 18, the sacrificial layer pattern 157 is removed through an etching process.

For example, the sacrificial layer pattern 157 is removed through a wet etching process using a liquid etchant, such as HF. As a result, a respective third opening 161 exposing part of each doping layer pattern 146 is formed. Each third opening 161 may extend in the first direction and a plurality of third openings 161 may be spaced from each other in the second direction.

Figure 19:
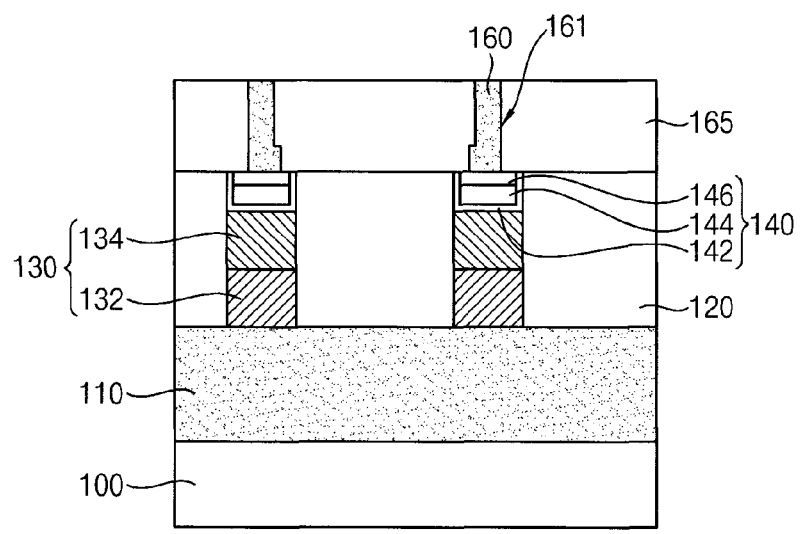

Referring to FIG. 19, the phase-change layer pattern 160 is formed to fill the third opening 161.

For example, in this embodiment, a phase-change layer of a chalcogenide material (previously described) is formed on the second insulating interlayer 165 to a thickness sufficient to fill the third opening 161, and the upper portion of the phase-change layer is polished until the top surface of the second insulating interlayer 165 is exposed, thereby forming the phase-change layer pattern 160. In this case, the phase-change layer can be formed through a sputtering process or a CVD process.

Also, and although not shown in the drawings, a fourth opening extending in the second direction is formed through the second insulating interlayer 165 and across the phase-change layer patterns 160, and the fourth opening is filled with an insulating material, such as silicon nitride. Thus, an array of phase-change layer patterns 160 in the first and second directions can be formed.

Figure 20:
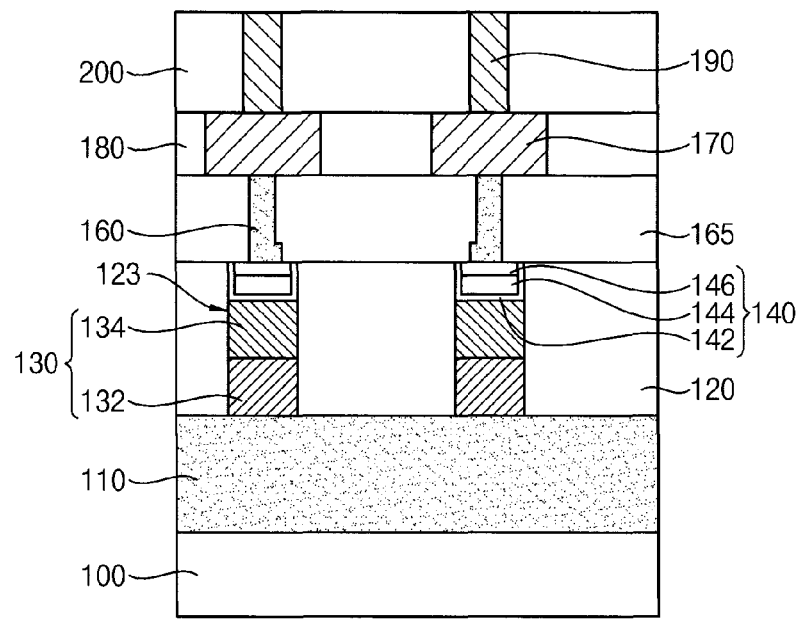

Referring to FIG. 20, the upper electrode 170 and the bit line 190 are formed.

For example, a third insulating interlayer 180 is formed on the phase-change layer pattern 160 and the second insulating interlayer 165, and then a fifth opening exposing the phase-change layer pattern 160 is formed. Then, a conductive layer for filling the fifth opening is formed on the phase-change layer pattern 160 and the third insulating interlayer 180, and the upper portion of the conductive layer is removed, thereby forming the upper electrode 170. In this case, the third insulating interlayer 180 can be formed of silicon oxide or silicon nitride.

The bit line 190 and the protective layer 200 are formed on the upper electrode 170 and the third insulating interlayer 180. The bit line 190 can be formed of metal or doped polysilicon and may extend in the first direction.

Another embodiment of a method of manufacturing a phase-change memory device in accordance with the inventive concept is illustrated in FIGS. 21 to 24.

Figure 21:
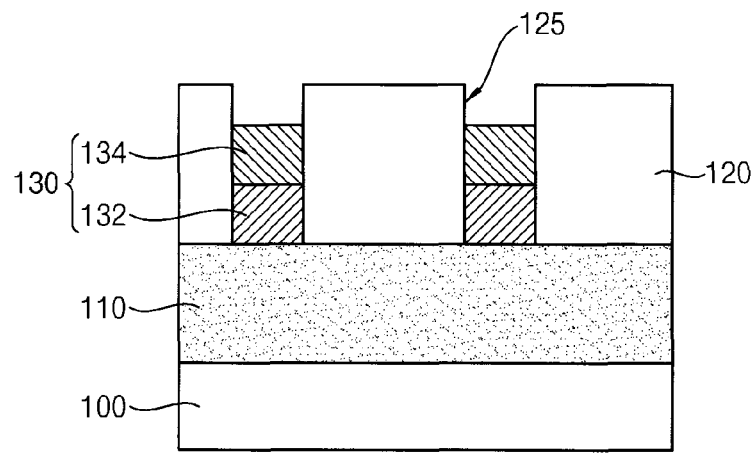
FIGS. 21 to 24 are sectional views illustrating an embodiment of a method of manufacturing a phase-change memory device, of the type shown in FIG. 3, in accordance with the inventive concept.

Referring to FIG. 21, processes similar to the processes described with reference to FIGS. 6 to 9 are performed to form the impurity region 110 on the substrate 100. Then, the P-N diode 130 is formed on the impurity region 110 through the first insulating interlayer 120 and then the first recess 125 is formed.

Figure 22:
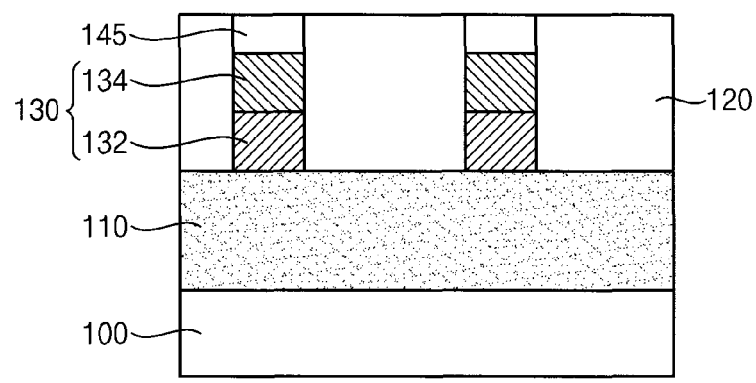

Referring to FIG. 22, a preliminary plug 145 is formed to fill the first recess 125.

In more detail, a preliminary plug layer is formed on inner walls of the first insulating interlayer 120 and the first recess 125. Then, an upper portion of the preliminary plug layer is etched away to form the preliminary plug 145.

In this respect, the preliminary plug layer can be formed of a metal such as Ta, Ti, Ru, Co, or Mn, or a metal nitride such as TiN or TaN, through a CVD process, PECVD process, ALD process or sputtering process. In the case in which the preliminary plug layer is of a metal nitride, such as TiN, the preliminary plug layer may have a superior interfacial characteristic, so that an additional barrier layer is unnecessary. Thus, the manufacturing process for the phase-change memory device is relatively simple.

After that, the upper portion of the preliminary plug layer is removed by performing a CMP process and/or etch-back process until the top surface of the first insulating interlayer 120 has been exposed.

Figure 23:
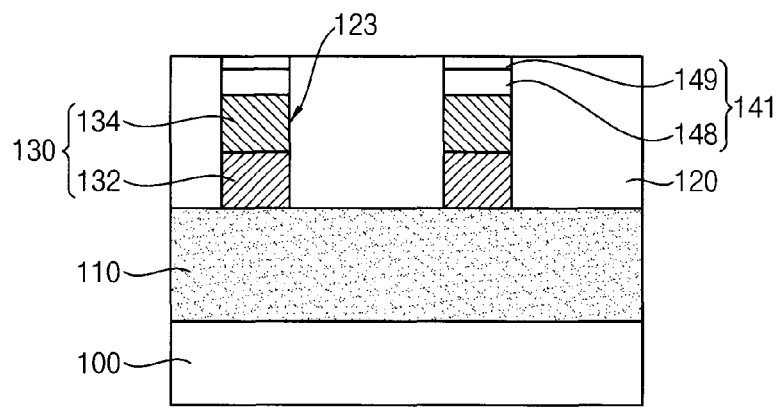

Referring to FIG. 23, the plug 148 and the doping layer pattern 149 are formed.

The plug 148 and the doping layer pattern 149 can be formed by implanting impurities into the upper portion of the preliminary plug 145. For instance, the impurities may be selected from among group 4A elements such as carbon (C), germanium (Ge), tin (Sn), lead (Pb) and silicon (Si), from among group 5A elements such as nitrogen (N), phosphor (P), arsenic (As), antimony (Sb), and bismuth (Bi), or from among group 6A elements such as oxygen (O), sulfur (S), selenium (Se), tellurium (Te), and polonium (Po). Preferably, the impurities are selected from the group consisting of carbon (C), nitrogen (N), oxygen (O), aluminum (Al), boron (B), phosphor (P), and silicon (Si).

The impurity implantation can be achieved through a heat treatment process or a plasma surface treatment process. As example of the plasma surface treatment process, carbon is implanted into the upper portion of the preliminary plug 145 by using plasma produced from source gas comprising hydrocarbons, such as acetylene ($C_2H_2$) or ethylene ($C_2H_4$). Thus, in cases in which the plug 148 is of a metal nitride, such as TiN, the doping layer pattern 149 is formed of a metal carbon nitride, such as TiCN, on the top surface of the plug 148. In addition, the doping layer pattern 149 may be formed of material whose electric resistance is higher than that of the plug 148. Also, the impurities are preferably implanted to a depth of about 10 nm to about 20 nm. That is, the doping layer pattern 149 can be formed to a thickness in the range of about 10 nm to about 20 nm.

In this embodiment, the plug structure 141 including the plug 148 and the doping layer pattern 149 and the P-N diode 130 are sequentially formed in the first opening 123. Thus, the process for forming the plug structure 141 is relatively simple. In addition, because the doping layer pattern 149, which is formed by implanting the impurities into the plug 148, may serve as the heater, no additional processes for forming a heater or a lower electrode are required. Thus, the manufacturing process for the phase-change memory device is relatively simple.

Figure 24:
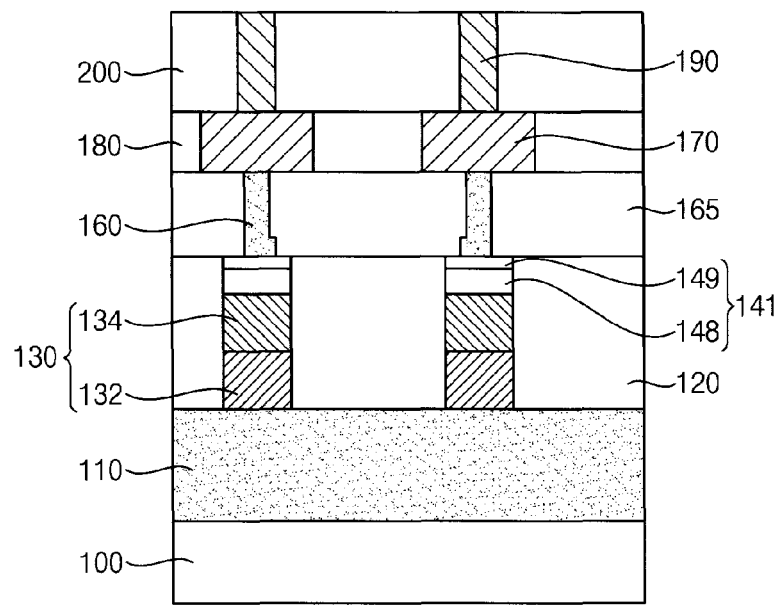

Referring to FIG. 24, the phase-change layer pattern 160, the upper electrode 170 and the bit line 190 are formed. To these ends, processes similar to the processes described with reference to FIGS. 12 to 20 are performed.

Still another embodiment of a method of manufacturing a phase-change memory device in accordance with the inventive concept is illustrated in FIGS. 25 to 34.

Figure 25:
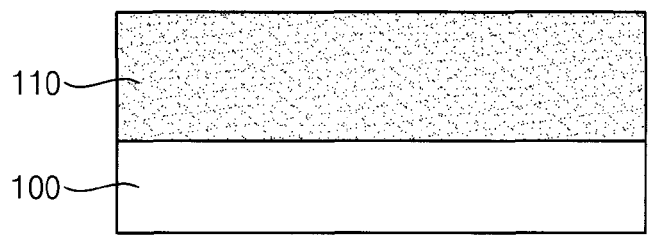
FIGS. 25 to 34 are sectional views illustrating an embodiment of a method of manufacturing a phase-change memory device, of the type shown in FIGS. 4-5B, in accordance with the inventive concept.

Referring to FIG. 25, the impurity region 110 is formed on the substrate 100 by processes similar to those described with reference to FIG. 6.

Figure 26:
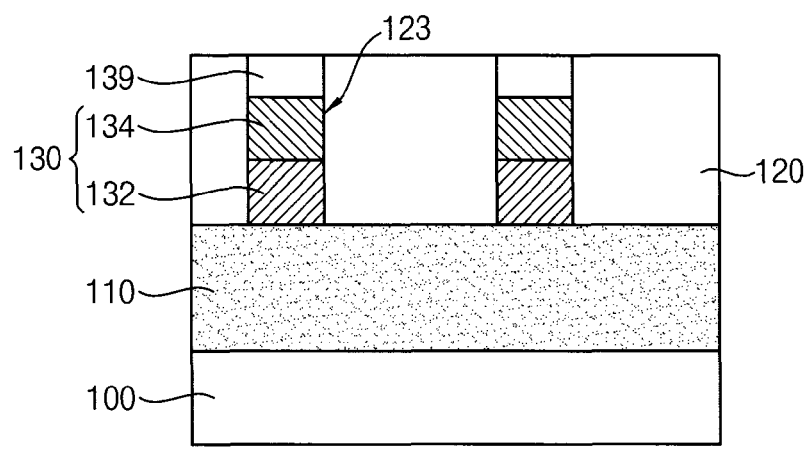

Referring to FIG. 26, the first insulating interlayer 120 is formed on the substrate 100 and the impurity region 110, and then the P-N diode 130 and the plug 139 are formed through the first insulating interlayer 120.

For example, the first insulating interlayer 120 is formed on the substrate 100 and the impurity region 110. Then, the first insulating interlayer 120 is etched to form the first opening 123 exposing the impurity region 110. Next, the P-N diode 130 and the plug 139 are sequentially formed on the impurity region 110 to fill the first opening 123. The plug 139 can be formed of a metal having a relatively low resistance, such as W, Ti, Ta, Mo, Hf, Zr, Cr, Nb or V, or a metallic compound including the metal, through a CVD process, PECVD process or ALD process.

Figure 27:
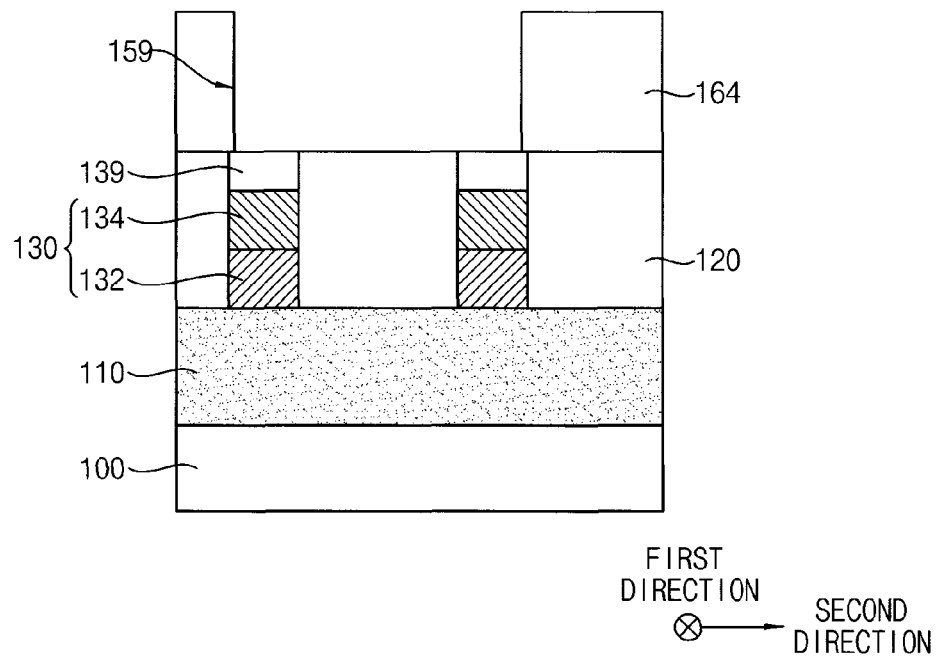

Referring to FIG. 27, preliminary second insulating interlayer 164 having second opening 159 is formed on the first insulating interlayer 120 and the plug 139.

The preliminary second insulating interlayer 164 can be formed of silicon nitride, such as SiN, through a CVD process, PECVD process, spin coating process or HDP-CVD process. After that, the second opening 159 for exposing part of each of at least one plug 139 and the first insulating interlayer 120 is formed by etching the preliminary second insulating interlayer 164.

Figure 28:
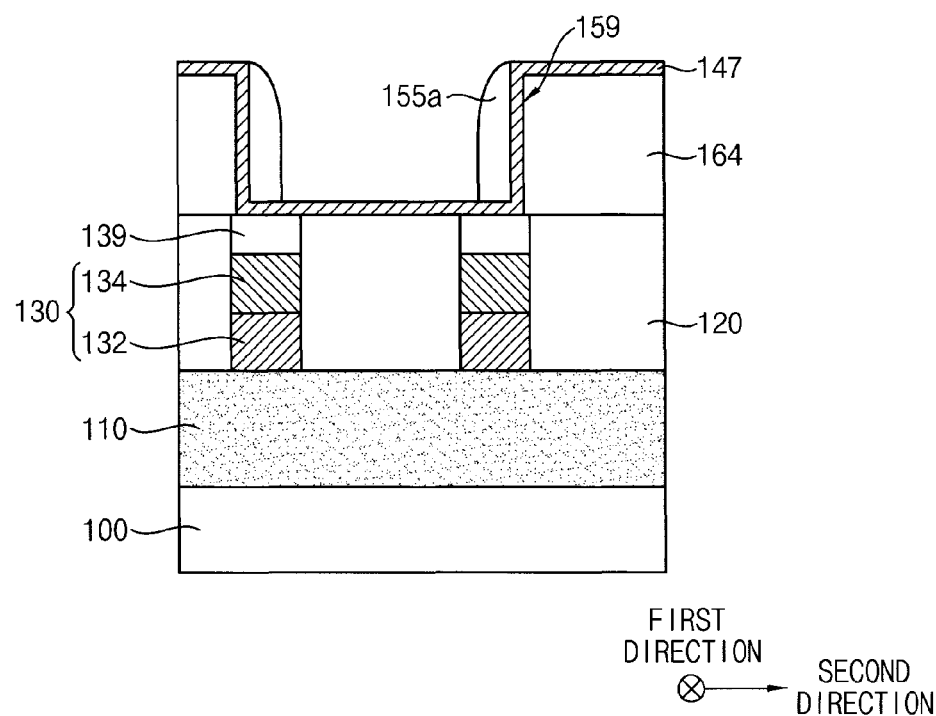

Referring to FIG. 28, a conductive layer 147 is formed on the top surfaces of the first insulating interlayer 120 and the plug 139, which are exposed through the second opening 159, a sidewall delimiting the second opening 159, and the preliminary second insulating interlayer 164. Then, mask 155a is formed adjacent along the sides of the second opening 159. The mask 155a can be formed in a manner similar to that described with reference to FIGS. 13 and 14. As a result, the mask 155a covers the sidewall of the conductive layer 147 that delimits the sides of the second opening 159.

The conductive layer 147 may be formed of a metal such as Ta, Ti, Tu, Co or Mn, or a metal nitride, such as TiN or TaN. In addition, the mask 155a may be formed of silicon nitride, such as SiN, through a CVD process, PECVD process, spin coating process or HDP-CVD process.

Figure 29:
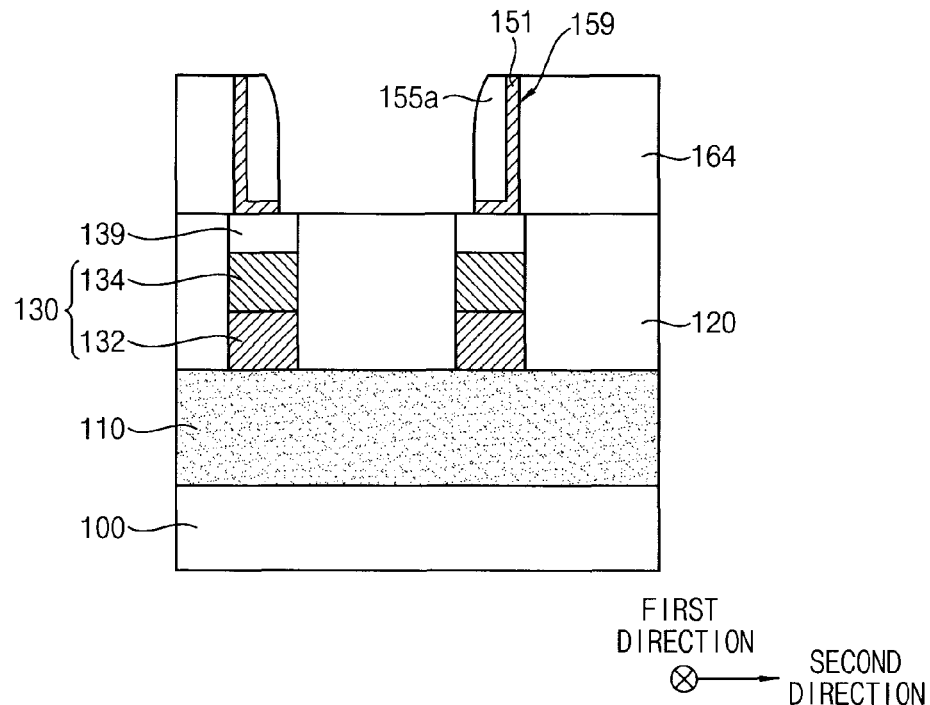

Referring to FIG. 29, a third conductive pattern 151 is formed by removing part of the conductive layer 147 through a process, e.g., a dry etching process, in a manner similar to that described with reference to FIG. 15.

Thus, the third conductive pattern 151 contacts the sidewall of the preliminary second insulating interlayer 164. Also, in this embodiment, the third conductive pattern 151 has a lower contacting the top surface of the plug 139 over a relatively large area, and an upper portion extending from the lower portion along the sidewall of the preliminary second insulating interlayer 164. And, as a result, a plurality of such third conductive patterns 151 are formed as each extending in the first direction and spaced from each other in the second direction.

Figure 30:
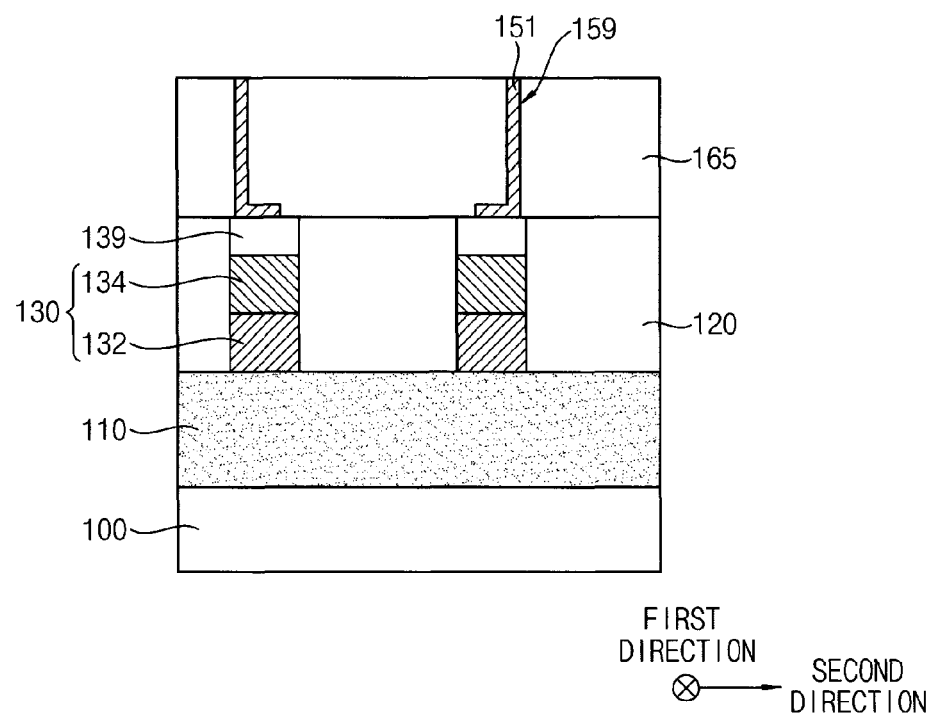

Referring to FIG. 30, second insulating interlayer 165 is formed by filling the remaining part of the second opening 159.

For example, an insulting layer of silicon nitride is formed to such a thickness as to fill the second opening 159. Then, the upper portion of the insulating layer is removed by a CMP process and/or the etch-back process until the top surface of the preliminary second insulating interlayer 164 has been exposed.

Figure 31:
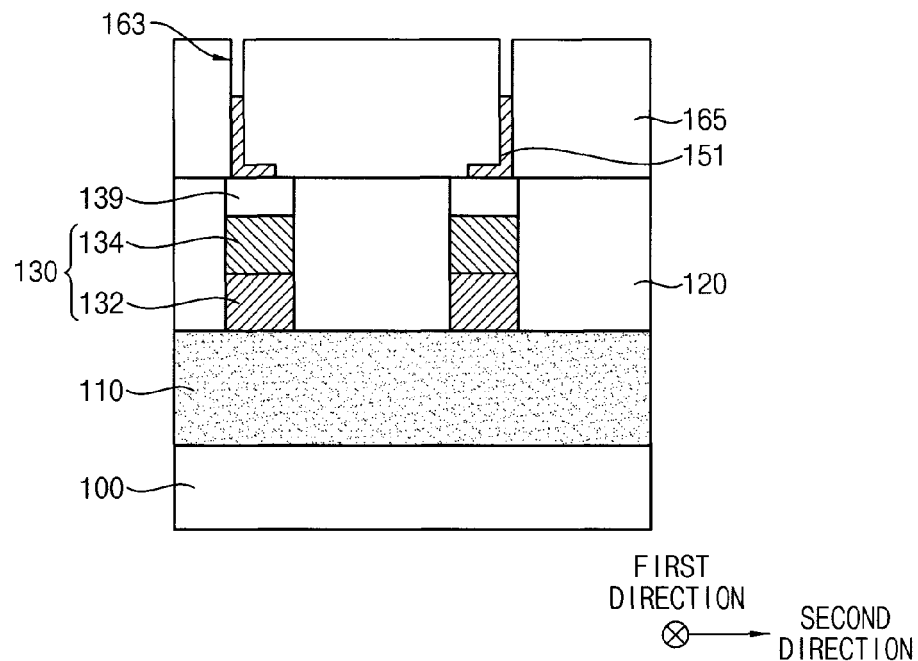

Referring to FIG. 31, a first recess 163 is formed by removing part of the third conductive pattern 151.

For example, the first recess 163 is formed by wet etching the upper portion of the third conductive pattern 151. The wet etching process may use SC1 as an etchant.

Figure 32:
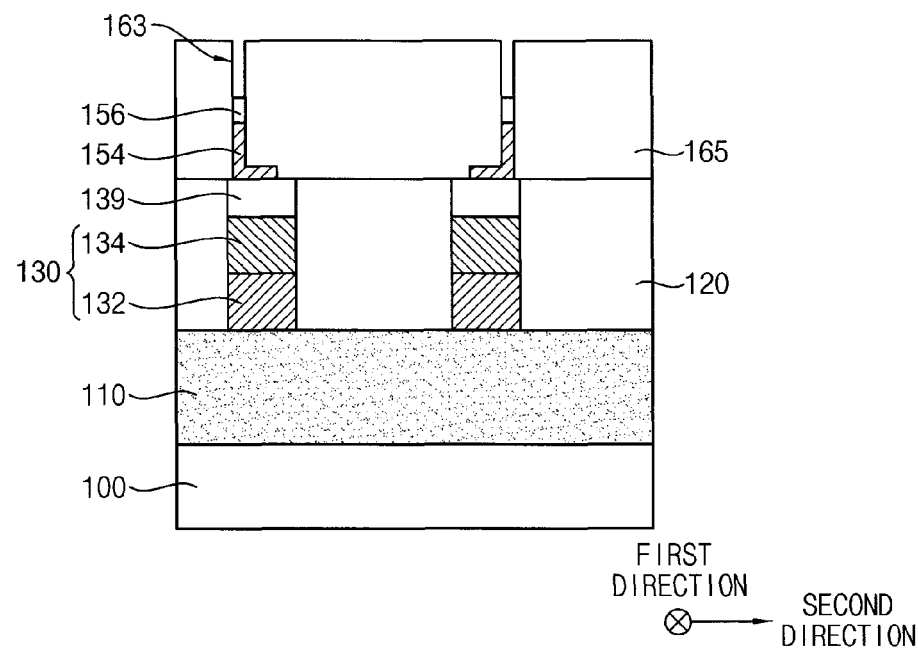

Referring to FIG. 32, lower electrode 154 and doping layer pattern 156 are formed by implanting impurities into the upper portion of the third conductive pattern 151. The impurities may be selected from among group 4A elements such as carbon (C), germanium (Ge), tin (Sn), lead (Pb) and silicon (Si), group 5A elements such as nitrogen (N), phosphor (P), arsenic (As), antimony (Sb), and bismuth (Bi), or group 6A elements such as oxygen (O), sulfur (S), selenium (Se), tellurium (Te), and polonium (Po). Preferably, the impurities are selected from the group consisting of carbon (C), nitrogen (N), oxygen (O), aluminum (Al), boron (B), phosphor (P), and silicon (Si).

The impurity implantation can be effected through a heat treatment process or a plasma surface treatment process. Preferably, the impurities are implanted to a depth of about 10 nm to about 20 nm. That is, the doping layer pattern 156 is preferably formed to a thickness in the range of about 10 nm to about 20 nm.

In examples of the plasma surface treatment used in this embodiment, carbon is implanted into the upper portion of the third conductive pattern 151 using plasma produced by source gas containing hydrocarbons, such as acetylene ($C_2H_2$) or ethylene ($C_2H_4$). Thus, the doping layer pattern 156 will be of a metal carbon nitride, such as TiCN, formed on the top surface of a lower electrode 154 of a metal nitride, such as TiN. In addition, the doping layer pattern 156 is formed of material whose electric resistance is higher than that of the lower electrode 154.

Figure 33:
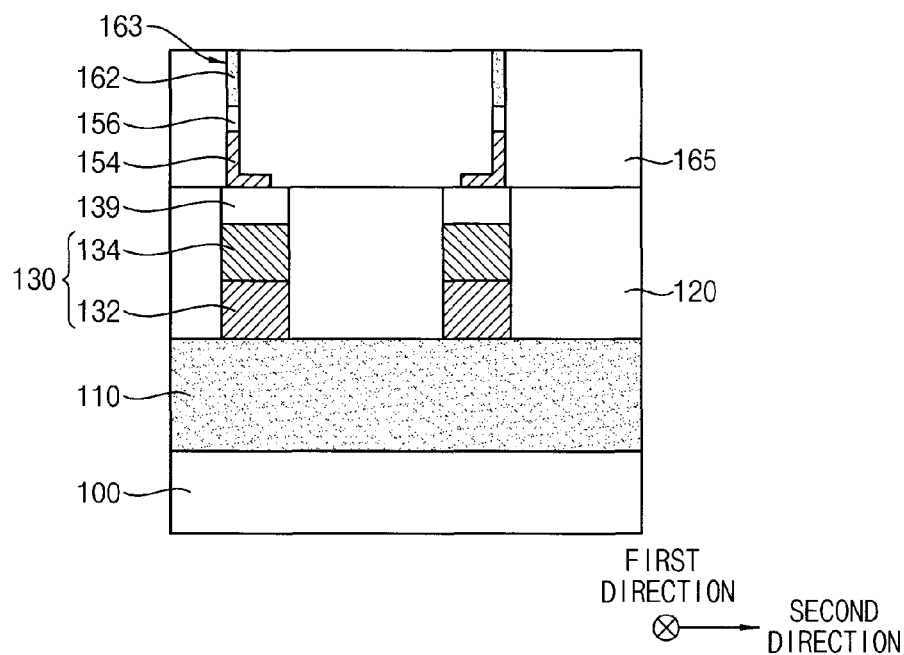

Referring to FIG. 33, phase-change layer pattern 162 is formed to fill the first recess 163.

For example, a phase-change layer of a chalcogenide material (previously described) is formed on the doping layer pattern 156 and the second insulating interlayer 165 to such a thickness as to fill the first recess 163. Then, the upper portion of the phase-change layer is polished until the top surface of the second insulating interlayer 165 is exposed.

As a result, the area of the bottom surface of the phase-change layer pattern 162 is the same as the area of the top surface of the doping layer pattern 156. That is, the phase-change layer pattern 162 is laminated on the doping layer pattern 156 formed from the same structure as the lower electrode 154. Thus, the forming of the phase-change layer pattern 162 and the doping layer pattern 156 is relatively simple.

Figure 34:
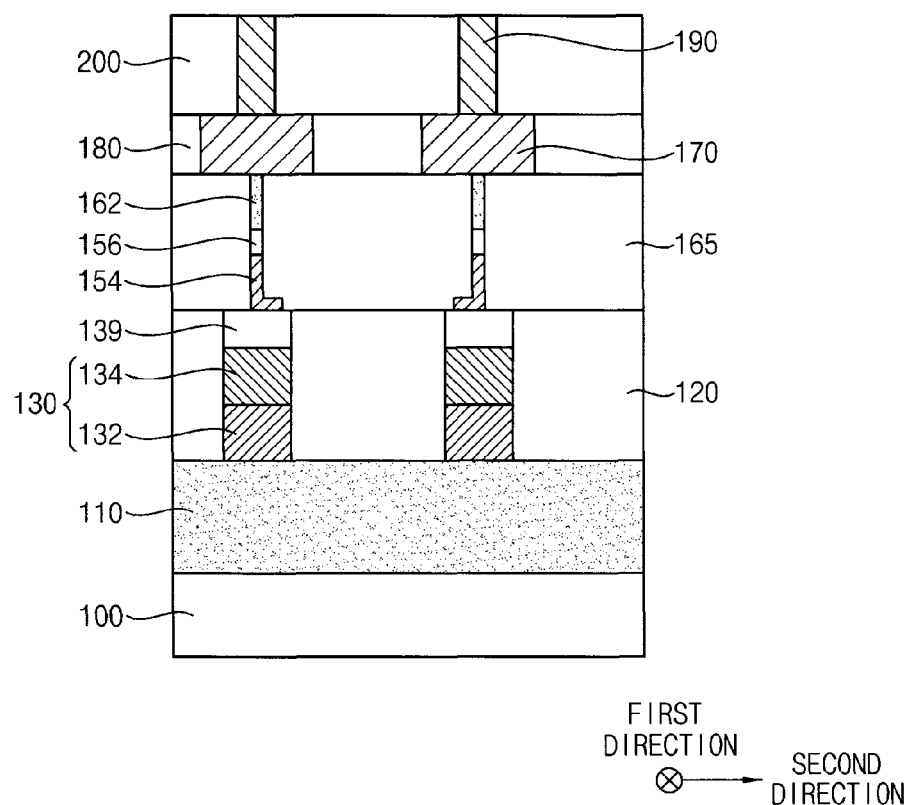

Referring to FIG. 34, the upper electrode 170 and the bit line 190 are formed by processes similar to the processes described with reference to FIG. 20.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A phase-change memory device, comprising:
a diode disposed on an upper surface of a substrate;
a heating element disposed on the diode, the heating element having a lower part of metal or a metallic compound disposed on the diode so as to receive current from the diode, and an upper part capable of converting current supplied thereto from the lower part to Joule's heat, the lower part having a bottom surface that faces towards the diode and a top surface, the upper part having a bottom surface that faces towards the top surface of the lower part, the area of the bottom surface of the upper part being equal to the area of the top surface of the lower part, and the upper part being of substantially the same metal or metallic compound as the lower part and containing a dopant of impurities by which the resistance of the upper part is made greater than that of the lower part;
a phase-change layer pattern disposed directly on the upper part of the heating element, wherein the upper part of the heating element serves as a heater for the phase-change layer pattern, and the phase-change layer pattern comprises material whose state can be selectively changed under the control of the heater;
an upper electrode disposed on the phase-change layer pattern; and
first and second insulating layers disposed on the substrate and having a respective opening extending therethrough, and wherein the diode occupies a lower portion of the opening in the first insulating layer, the heating element occupies an upper portion of the opening in the first insulating layer, and the phase-change layer pattern is disposed in the opening in the second insulating layer,
wherein the lower part of the heating element is a plug of metal selected from the group consisting of tungsten (W), titanium (Ti), tantalum (Ta), molybdenum (Mo), hafnium (Hf), zirconium (Zr), chrome (Cr), niobium (Nb), and vanadium (V),
the heating element further comprises a barrier layer of a metal or a metallic nitride interposed between the plug and the diode, between the plug and the first insulating layer, and between the upper portion of the heating element and the first insulating layer,
the diode and the barrier layer have laterally outer surfaces, respectively, that are contiguous with one another,
the upper part of the heating element containing the impurities and the phase-change layer pattern have top and bottom surfaces, respectively, that contact each other, the area of the top surface of the upper part of the heating element being larger than the area of the bottom surface of the phase-change layer pattern.

2. The phase-change memory device of claim 1, wherein the impurities are of at least one element selected from the group consisting of carbon (C), nitrogen (N), oxygen (O), aluminum (Al), boron (B), phosphor (P), and silicon (Si).

3. The phase-change memory device of claim 1, wherein the material of the phase-change layer pattern is a chalcogenide.

4. The phase-change memory device of claim 1, wherein the plug is disposed directly on the diode.

5. The phase-change memory device of claim 1,
wherein the plug contacts a top surface of the diode, and
the lower part of the heating element is a lower electrode having a bottom surface that contacts an upper surface of the plug.

6. The phase-change memory device of claim 5, wherein the diode comprises a lower pattern of material of one conductivity type, and an upper pattern of material of another conductivity type,
the plug is of material whose resistance is less than that of surfaces of the lower electrode and the diode which the plug contacts.

7. The phase-change memory device of claim 6, wherein the plug is of a metal silicide.

8. The phase-change memory device of claim 6, wherein the upper part of the heating element containing the impurities has an upper surface, and the area of the bottom surface of the lower electrode is greater than that of the upper surface of the heating element.

9. The phase-change memory device of claim 5, wherein the upper part of the heating element containing the impurities has an upper surface, and the area of the bottom surface of the lower electrode is greater than that of the upper surface of the heating element.

10. A phase-change memory device, comprising:
a diode disposed on a substrate, the diode having a top surface and a bottom surface;
a plug of metal or a conductive metallic compound disposed on the top surface of the diode such that the plug has a bottom surface that faces towards the top surface of the diode, and the area of the bottom surface of the plug being equal to the area of the top surface of the diode;
a doping layer pattern located on the plug such that the bottom of the doping layer pattern faces the top of the plug, the area of the bottom of the doping layer pattern being equal to the area of the top of the plug, and the doping layer pattern being of substantially the same metal or metallic compound as the plug and containing a dopant of impurities;
a phase-change layer pattern disposed on the doping layer pattern; and
an upper electrode disposed on the phase-change layer pattern.

11. The phase-change memory device of claim 10, wherein the impurities are of at least one element selected from the group consisting of carbon (C), nitrogen (N), oxygen (O), aluminum (Al), boron (B), phosphor (P), and silicon (Si).

12. The phase-change memory device of claim 10, wherein the diode, the plug and the doping layer pattern have laterally outer surfaces, respectively, and projections of the outer surfaces in an axial direction perpendicular to the substrate are coextensive.

13. The phase-change memory device of claim 10, wherein the diode has the shape of a cylinder, cylindroid shape or polygonal prism, and the plug and the doping layer pattern each have a shape similar to the shape of the diode.

14. The phase-change memory device of claim 10, wherein the doping layer pattern has a top surface, the phase-change layer pattern has a bottom surface facing the top surface of the doping layer pattern, and the area of the bottom surface of the phase-change layer pattern is smaller than that of a top surface of the doping layer pattern.

15. The phase-change memory device of claim 10, wherein the plug comprises a metal selected from the group consisting of tungsten (W), titanium (Ti), tantalum (Ta), molybdenum (Mo), hafnium (Hf), zirconium (Zr), chrome (Cr), niobium (Nb), and vanadium (V), or a nitride of the metal.

16. The phase-change memory device of claim 10, further comprising a barrier layer pattern covering the bottom surface of the plug and laterally outer surfaces of the plug and doping layer pattern,
wherein the plug includes a metal selected from the group consisting of tungsten (W), titanium (Ti), tantalum (Ta), molybdenum (Mo), hafnium (Hf), zirconium (Zr), chrome (Cr), niobium (Nb), and vanadium (V).

17. The phase-change memory device of claim 10, wherein the resistance of the doping layer pattern is higher than that of the plug.

18. A phase-change memory device, comprising:
a diode disposed on a substrate;
a plug disposed on the diode and comprising a metal silicide;
a lower electrode disposed on the plug and having a bottom surface and an uppermost portion, wherein the cross-sectional area of the uppermost portion of the lower electrode is smaller than the area of the bottom surface thereof, and the lower electrode comprises metal or a conductive metallic compound;
a doping layer pattern on the lower electrode, the doping layer pattern having a top surface and a bottommost portion, wherein the cross-sectional area of the bottom portion of the doping layer pattern is equal to the cross-sectional area of the uppermost portion of the lower electrode, and the doping layer pattern is of substantially the same metal or conductive metallic compound as the lower electrode and contains a dopant of impurities;
a phase-change layer pattern disposed on the doping layer pattern, the phase-change layer pattern having a top surface and a bottom surface, wherein the area of the bottom surface of the phase-change layer pattern is substantially equal to that of the top surface of the doping layer pattern; and
an upper electrode disposed on the phase-change layer pattern.

* * * * *